United States Patent
Sakamaki

(10) Patent No.: US 10,303,260 B2
(45) Date of Patent: May 28, 2019

(54) SWITCH DEVICE

(71) Applicant: DENSO CORPORATION, Kariya, Aichi-pref. (JP)

(72) Inventor: Tomohiko Sakamaki, Kariya (JP)

(73) Assignee: DENSO CORPORATION, Kariya, Aichi-pref. (JP)

( * ) Notice: Subject to any disclaimer, the term of this patent is extended or adjusted under 35 U.S.C. 154(b) by 383 days.

(21) Appl. No.: 15/026,068

(22) PCT Filed: Sep. 11, 2014

(86) PCT No.: PCT/JP2014/004709
§ 371 (c)(1),
(2) Date: Mar. 30, 2016

(87) PCT Pub. No.: WO2015/049837
PCT Pub. Date: Apr. 9, 2015

(65) Prior Publication Data
US 2016/0239101 A1    Aug. 18, 2016

(30) Foreign Application Priority Data

Oct. 2, 2013 (JP) ................................. 2013-207433
May 13, 2014 (JP) ................................. 2014-099964

(51) Int. Cl.
*G06F 3/02*    (2006.01)
*G06F 3/044*    (2006.01)
(Continued)

(52) U.S. Cl.
CPC ............... *G06F 3/02* (2013.01); *G06F 3/016* (2013.01); *G06F 3/044* (2013.01); *G09G 5/10* (2013.01);
(Continued)

(58) Field of Classification Search
CPC . G06F 3/02; G06F 3/016; G06F 3/044; G06F 2203/04108; G09G 5/10;
(Continued)

(56) References Cited

U.S. PATENT DOCUMENTS 8,743,099 B2 * 6/2014 Lin .......................... G09G 5/00
345/102
9,030,418 B2 * 5/2015 Ku ........................ G06F 3/0416
345/156
(Continued)

FOREIGN PATENT DOCUMENTS

JP    2006128019 A    5/2006
JP    2006145488 A    6/2006
(Continued)

OTHER PUBLICATIONS

International Search Report and Written Opinion (in Japanese with English Translation) for PCT/JP2014/004709, dated Oct. 7, 2014; ISA/JP.

*Primary Examiner* — Patrick N Edouard
*Assistant Examiner* — Eboni N Hughes
(74) *Attorney, Agent, or Firm* — Harness, Dickey & Pierce, P.L.C.

(57) ABSTRACT

A switch device includes a control portion that performs brightness adjustment control. Under the brightness adjustment control, a detection portion acquires capacitance of several electrode portions. The control portion allows a brightness adjustment portion to increase brightness of design portions corresponding to all the electrode portions whose capacitance exceeds an approach determination threshold value so that the increased brightness is higher than original brightness. The control portion maintains brightness control by the brightness adjustment portion when the capacitance exceeds the approach determination threshold value and is lower than a switch-on determination (Continued)

threshold value. When the capacitance exceeds a predetermined switch-on determination threshold value, the control portion turns on a switch portion corresponding to the electrode portion to operate an instrument, and subsequently returns the brightness by the brightness adjustment portion to the original brightness.

14 Claims, 15 Drawing Sheets

(51) Int. Cl.
*H03K 17/96* (2006.01)
*G06F 3/01* (2006.01)
*G09G 5/10* (2006.01)
*H03K 17/955* (2006.01)

(52) U.S. Cl.
CPC ......... *H03K 17/955* (2013.01); *H03K 17/962* (2013.01); *H03K 17/9622* (2013.01); *G06F 2203/04108* (2013.01); *G09G 2380/10* (2013.01); *H01H 2219/039* (2013.01); *H01H 2239/006* (2013.01); *H03K 2217/96062* (2013.01); *H03K 2217/960785* (2013.01)

(58) Field of Classification Search
CPC ............. G09G 2380/10; H03K 17/955; H03K 17/962; H03K 17/9622; H03K 2217/96062; H03K 2217/960785; H01H 2219/039; H01H 2239/006
See application file for complete search history.

(56) References Cited

U.S. PATENT DOCUMENTS

| | | | | |
|---|---|---|---|---|
| 9,711,090 | B2* | 7/2017 | Satou | G06F 3/0488 |
| 2006/0256094 | A1* | 11/2006 | Inagaki | G01C 21/3611 |
| | | | | 345/173 |
| 2009/0201266 | A1* | 8/2009 | Hashimoto | A61B 8/00 |
| | | | | 345/173 |
| 2009/0207154 | A1* | 8/2009 | Chino | G06F 3/0416 |
| | | | | 345/175 |
| 2012/0139855 | A1* | 6/2012 | Suh | G06F 3/042 |
| | | | | 345/173 |
| 2013/0231161 | A1* | 9/2013 | Hsu | G09G 3/3648 |
| | | | | 455/566 |
| 2013/0328842 | A1* | 12/2013 | Barnhoefer | G09G 3/3406 |
| | | | | 345/207 |
| 2014/0028545 | A1* | 1/2014 | Tsai | G06F 3/005 |
| | | | | 345/156 |
| 2014/0062958 | A1 | 3/2014 | Onishi | |
| 2014/0354567 | A1* | 12/2014 | Park | G06F 3/0488 |
| | | | | 345/173 |
| 2015/0067570 | A1* | 3/2015 | Yoon | G06F 3/04886 |
| | | | | 715/773 |

FOREIGN PATENT DOCUMENTS

| | | |
|---|---|---|
| JP | 2007018811 A | 1/2007 |
| JP | 2009117153 A | 5/2009 |
| JP | 2013003842 A | 1/2013 |

* cited by examiner

SWITCH DEVICE

CROSS REFERENCE TO RELATED APPLICATIONS

This application is a U.S. National Phase Application under 35 U.S.C. 371 of International Application No. PCT/JP2014/004709 filed on Sep. 11, 2014 and published in Japanese as WO 2015/049837 A1 on Apr. 9, 2015. This application is based on and claims the benefit of priority from Japanese Patent Applications No. 2013-207433 filed on Oct. 2, 2013, and No. 2014-099964 filed on May 13, 2014. The entire disclosures of all of the above applications are incorporated herein by reference.

TECHNICAL FIELD

The present disclosure relates to a switch device that inputs an operation condition to a specified instrument mounted on a vehicle.

BACKGROUND ART

Patent literature 1 describes a switch device according to the prior art. The switch device according to patent literature 1 includes several switch portions formed by a detection electrode. Each switch portion includes a light source corresponding to each detection electrode. The detection electrode and the light source are connected to a switch circuit. The switch circuit includes a selection switch to select a first connection state or a second connection state. The first connection state connects all detection electrodes to one dedicated detection circuit. The second connection state connects each detection electrode to a discrete detection circuit.

The light source turns off when a user's finger does not approach the switch portion. The selection switch allows all the detection electrodes to maintain the first connection state. All the detection electrodes are connected to the dedicated detection circuit to increase an apparent area for the detection electrodes and provide high sensitivity.

When the user's finger approaches the switch portions, the dedicated detection circuit outputs a first detection value (capacitance change). When the first detection value exceeds a predetermined first threshold value, all the light sources turn on. The selection switch changes the detection electrodes to the second connection state. The detection electrode corresponds to the discrete detection circuit on a one-to-one basis. Each detection electrode provides the standard sensitivity.

When the user's finger approaches one of the switch portions, the discrete detection circuit connected to the detection electrode for that specific switch portion outputs a second detection value. When the second detection value exceeds a predetermined second threshold value, only the light source corresponding to the specific switch portion turns on. The light sources corresponding to the remaining switch portions turn off.

According to patent literature 1, each light source is controlled to turn on or off depending on the state of an operator's finger approaching each switch portion. This aims at improving operability in a dark place. The selection switch provides the first connection state to enable the detection by improving the apparent sensitivity of each detection electrode. The selection switch provides the second connection state to enable the detection at respective detection electrodes based on the standard sensitivity. The state of approaching user's finger can be detected with stable accuracy.

PRIOR ART LITERATURES

Patent Literature

[Patent Literature 1] JP2007-18811A

SUMMARY OF INVENTION

The switch device according to patent literature 1 aims at improving the operability in a dark place. The selection switch varies the sensitivity of each detection electrode corresponding to each threshold value to ensure the detection with stable accuracy. The switch device does not guide the operator in successively choosing the switch portions so that the operator can easily select a targeted one of the switch portions.

According to patent literature 1, all the light sources turn on when a user's finger approaches each switch portion. This is obtrusive to the user.

When the user's finger approaches a specific switch portion according to patent literature 1, only the light source corresponding to the specific switch portion turns on. The light sources corresponding to the remaining switch portions turn off. The user cannot easily visually select the other switch portions if the user inadvertently selects the switch portion and attempts to select another switch portion.

The present disclosure has been made in consideration of the foregoing. It is an object of the disclosure to provide a switch device capable of effectively guiding an operator in selecting a targeted one of switch portions.

According to a first aspect of the disclosure, a switch device for a vehicle inputs an operation condition to a specified instrument according to user's finger manipulation. The switch device includes switch portions, a detection portion, a brightness adjustment portion, and a control portion. The switch portions are provided with design portions indicating switch functions and overlapping with several electrode portions. The detection portion detects a capacitance change generated in accordance with a distance between the user's finger and each of the electrode portions. The brightness adjustment portion adjusts the brightness of each of the design portions. The control portion performs a brightness adjustment control. In the brightness adjustment control, when the finger approaches the electrode portions and the detection portion acquires the capacitance of the electrode portions, the control portion allows the brightness adjustment portion to increase the brightness of the design portions corresponding to all the electrode portions whose capacitance exceeds a predetermined approach determination threshold value so that the increased brightness is higher than the original brightness of the design portions. The control portion maintains the brightness control performed by the brightness adjustment portion when the finger approaches any of the electrode portions, and the capacitance exceeds the approach determination threshold value and falls short of a predetermined switch-on determination threshold value that is larger than the approach determination threshold value. The control portion turns on the switch portion corresponding to the electrode portion whose the capacitance exceeds the switch-on determination threshold value to operate the instrument, and subsequently returns the brightness increased by the brightness adjustment portion to the original brightness.

When the user's finger approaches the electrode portions, the configuration increases the brightness of the design portions corresponding to all the electrode portions whose capacitance exceeds the approach determination threshold value. The user can first recognize an area of switch portions to be manipulated and then easily recognize a targeted one of the switch portions. The user can be effectively guided to select a targeted switch portion.

The user may have selected an incorrect switch portion and may need to select another switch portion. Even in such a case, the control portion maintains the brightness using the brightness adjustment portion when the finger approaches the electrode portions and the capacitance exceeds the approach determination threshold value and falls short of the switch-on determination threshold value. The user can be guided to effectively select another switch portion anew.

The control portion turns on the switch corresponding to the electrode portion whose capacitance exceeds the switch-on determination threshold value. The brightness of the design portion returns to the original brightness after the instrument is operated. The design portion does not remain obtrusive to the user. The user can recognize that the instrument is operated normally.

According to a second aspect of the disclosure, a switch device for a vehicle inputs an operation condition to a specified instrument according to user's finger manipulation. The switch device includes switch portions, a detection portion, a brightness adjustment portion, and a control portion. The switch portions include design portions displaying switch functions to overlap with each of several electrode portions. The detection portion detects a capacitance change generated in accordance with a distance between the user's finger and each of the electrode portions. The brightness adjustment portion adjusts brightness of each of the design portions. The control portion controls brightness of the brightness adjustment portion.

When the brightness adjustment portion turns on, the switch portion performs night illumination on the design portion. During the night illumination, when the finger approaches the electrode portions and the detection portion acquires the capacitance of the electrode portions, the control portion decreases brightness of the design portion corresponding to an electrode portion other than all the electrode portions whose capacitance exceeds a predetermined first approach determination threshold value so that the decreased brightness is lower than brightness corresponding to the brightness adjustment portion that was turned on. When the finger further approaches any of the electrode portions, the control portion increases brightness of the design portion corresponding to all the electrode portions whose capacitance exceeds a predetermined second approach determination threshold value larger than the first approach determination threshold value and falls short of a predetermined switch-on determination threshold value that is larger than the second approach determination threshold value so that the increased brightness is higher than brightness corresponding to the brightness adjustment portion that was turned on. When the capacitance exceeds the switch-on determination threshold value, the control portion turns on the switch portion corresponding to the electrode portion whose capacitance exceeds the switch-on determination threshold value to operate the instrument and subsequently returns the brightness increased by the brightness adjustment portion to brightness corresponding to the brightness adjustment portion that was turned on.

This configuration also provides an effect similar to that described above.

According to a third aspect of the disclosure, a switch device for a vehicle inputs an operation condition to a specified instrument according to user's finger manipulation. The switch device includes several switch portions, a detection portion, a brightness adjustment portion, and a control portion. The switch portions are used for input. The detection portion detects a distance between the user's finger and each of the switch portions. The brightness adjustment portion adjusts the brightness of each of the switch portions. The control portion performs a brightness adjustment control. In the brightness adjustment control, then the finger approaches the switch portions and the detection portion acquires the manipulation distances, the control portion allows the brightness adjustment portion to increase the brightness of all the switch portions whose manipulation distances are shorter than a predetermined approach determination threshold value so that the increased brightness is higher than original brightness of the switch portions. The control portion maintains a brightness control performed by the brightness adjustment portion when the finger approaches any of the switch portions and the manipulation distance is smaller than the approach determination threshold value and is larger than a predetermined switch-on determination threshold value that is smaller than the approach determination threshold value. When the manipulation distance falls short of the switch-on determination threshold value, the control portion turns on the switch portion to operate the instrument and subsequently returns the brightness increased by the brightness adjustment portion to the original brightness.

This configuration also provides an effect similar to that described above.

According to a fourth aspect of the disclosure, a switch device for a vehicle inputs an operation condition to a specified instrument according to manipulation of part of a user's body. The switch device includes switch portions, a detection portion, a brightness adjustment portion, and a control portion. The switch portions include design portions displaying switch functions so as to overlap with several electrode portions. The detection portion detects a capacitance change generated in accordance with a distance between the part of the body and each of the electrode portions. The brightness adjustment portion adjusts brightness of the design portions. The control portion performs a brightness adjustment control to control brightness of the brightness adjustment portion. In the brightness adjustment control, when the detection portion acquires capacitances of the electrode portions and any of the capacitances exceeds the first approach determination threshold value, the control portion identifies all the design portions corresponding to the electrode portion whose capacitance exceeds the first approach determination threshold value as a specific design portion. The control portion controls the brightness adjustment portion so that brightness of the specific design portion is higher than brightness of the design portion other than the specific design portion. The control portion controls the brightness adjustment portion to maintain brightness of the brightened specific design portion when capacitance of the electrode portion corresponding to the specific design portion is higher than the first approach determination threshold value and is lower than a second approach determination threshold value larger than the first approach determination threshold value.

When capacitance of the electrode portion corresponding to any of the design portions exceeds the second approach determination threshold value, the control portion controls the brightness adjustment portion so that brightness of the any of the design portions identified with the specific design portion is higher than the brightness of the other specific design portions. The design portion whose brightness is to be increased corresponds to the electrode portion whose capacitance exceeds the second approach determination threshold value.

When the capacitance of the electrode portion in excess of the second approach determination threshold value exceeds a switch-on determination threshold value larger than the second approach determination threshold value, the control portion turns on the switch portion corresponding to the electrode portion and subsequently controls the brightness adjustment portion so that brightness of the design portion of the switch portion equals brightness of all the other design portions.

This configuration also provides an effect similar to that described above.

BRIEF DESCRIPTION OF DRAWINGS

The foregoing and other advantages and features of the disclosure will become more apparent from the detailed description of the preferred embodiments of the invention given below with reference to the accompanying drawings in which.

DETAILED DESCRIPTION

Figure 1:
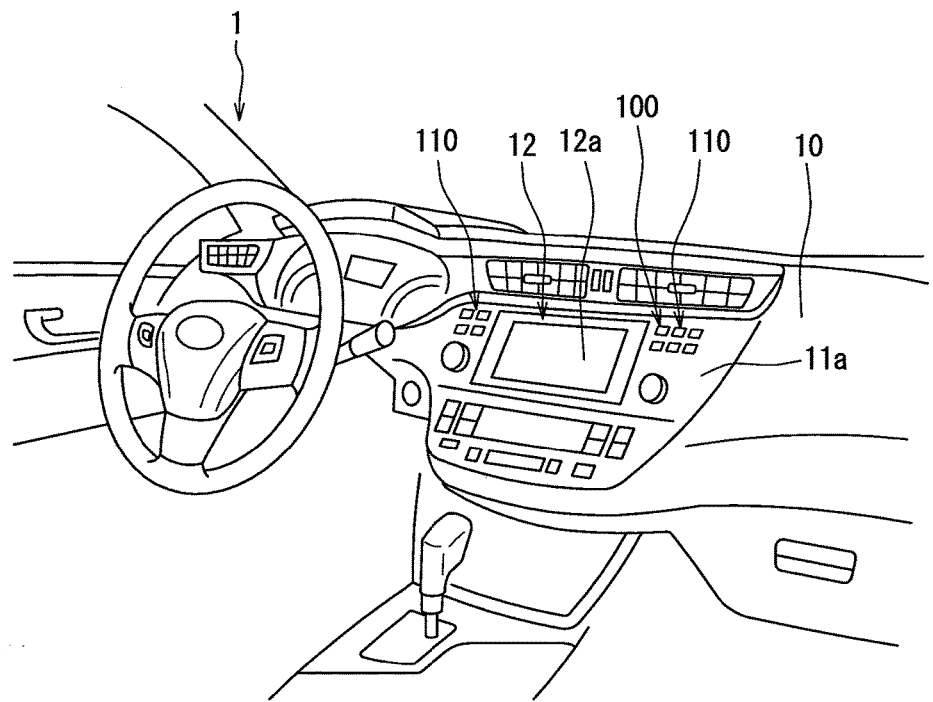
FIG. 1 is a schematic diagram illustrating a switch device for a vehicle according to a first embodiment.

The following describes embodiments of the disclosure with reference to the accompanying drawings. In each embodiment, the same reference numerals are given to elements corresponding to those described in a preceding embodiment and a duplicate description may be omitted for simplicity. When each embodiment describes only part of the configuration, the other parts of the configuration may conform to the description in the other preceding embodiments. The disclosure is not limited to an explicitly stated possible combination of parts of each embodiment. The embodiments may be partially combined with each other if a combination, though not explicitly stated, causes no difficulty.

First Embodiment

With reference to FIGS. 1 through 10, the following describes a switch device for a vehicle 100 according to the first embodiment of the disclosure. The switch device for a vehicle 100 according to the embodiment is applied to an automobile navigation system 12 as a specific vehicular instrument.

Figure 2:
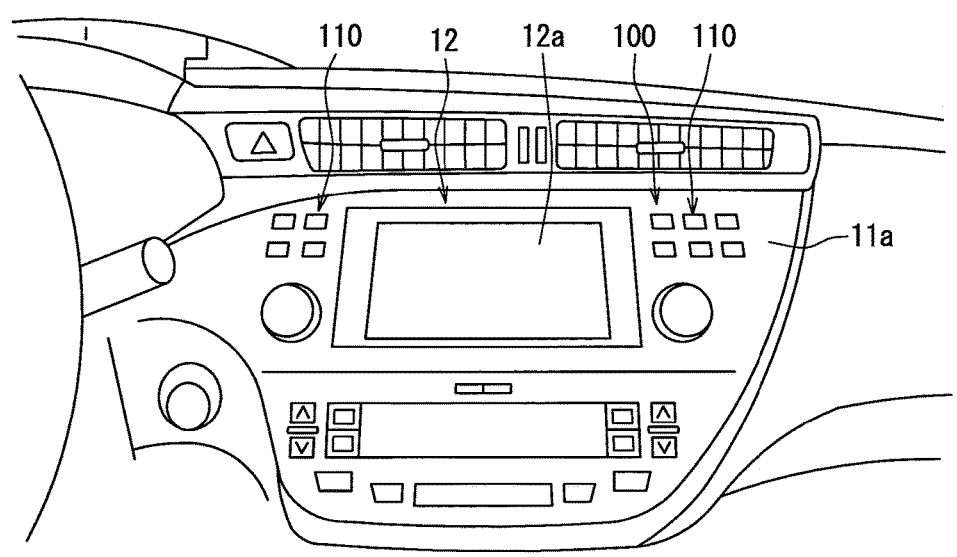
FIG. 2 is an enlarged front view of the switch device illustrated in FIG. 1.
Figure 3:
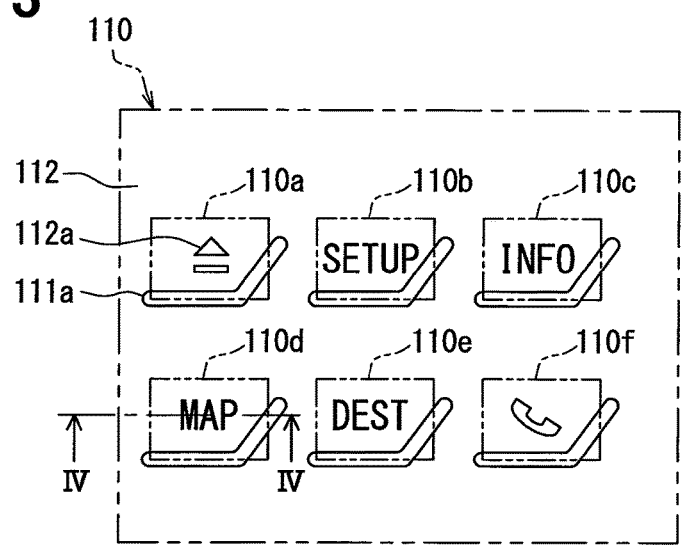
FIG. 3 is a front view illustrating an input portion of the switch device illustrated in FIG. 2.

As illustrated in FIGS. 1 through 3, the automobile navigation system 12 is provided as a route guidance system that uses a display 12a to display a map, a current position of the vehicle on the map, a travel direction, and guidance information about a targeted destination. The automobile navigation system 12 includes the route guidance function and an audio function, a handsfree mobile telephone function, and a radio function. The automobile navigation system 12 is provided for a navigation panel 11a that is formed approximately at the horizontal center of an instrument panel 10 of the vehicle.

The display 12a is provided as a display portion that uses a screen to selectively display several pieces of information. The display 12a is placed in the navigation panel 11a at an easily viewable position for a driver (user). The display 12a is available as a liquid crystal display or an organic EL display. The information displayed on the display 12a includes map information associated with the route guidance, vehicle position information, destination search information, guidance information based on audio or text, song titles of a music CD in replay, travel-related vehicle information, and radio station information. These types of display information can be selected by using switches 110a through 110f (FIG. 3) of an input portion 110 to be described later.

Figure 4:
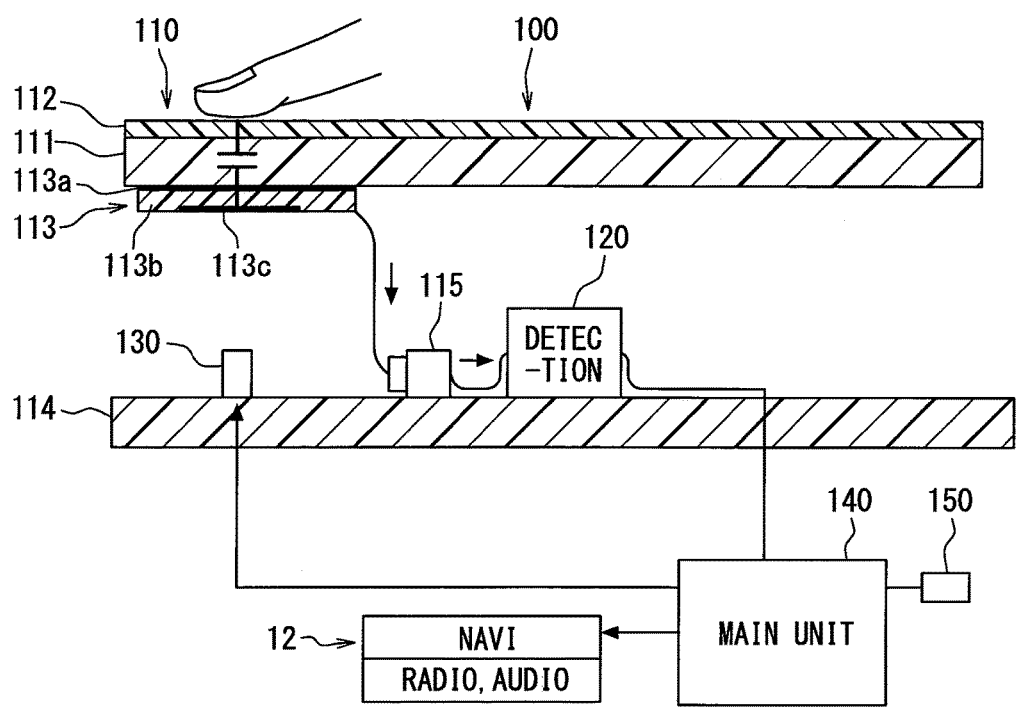
FIG. 4 is a cross sectional view taken along the line IV-IV of FIG. 3.
Figure 5:
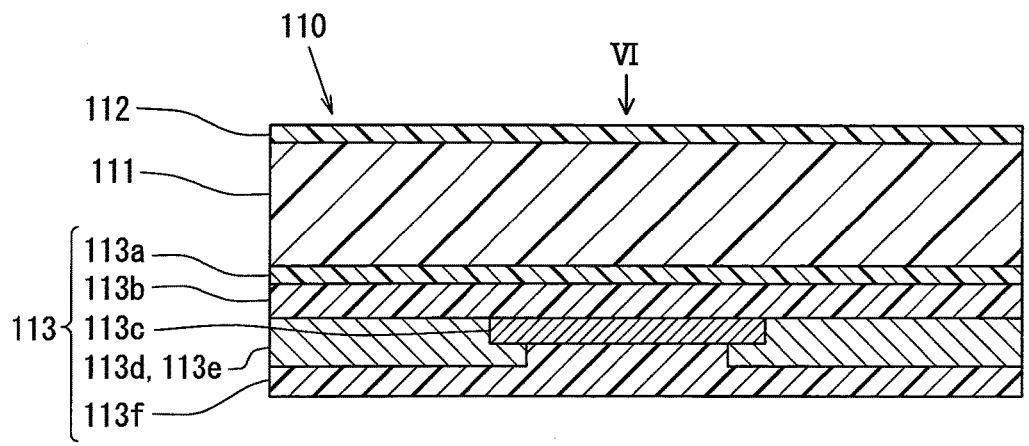
FIG. 5 is an expanded sectional view illustrating an electrostatic switch sheet in FIG. 4.
Figure 6:
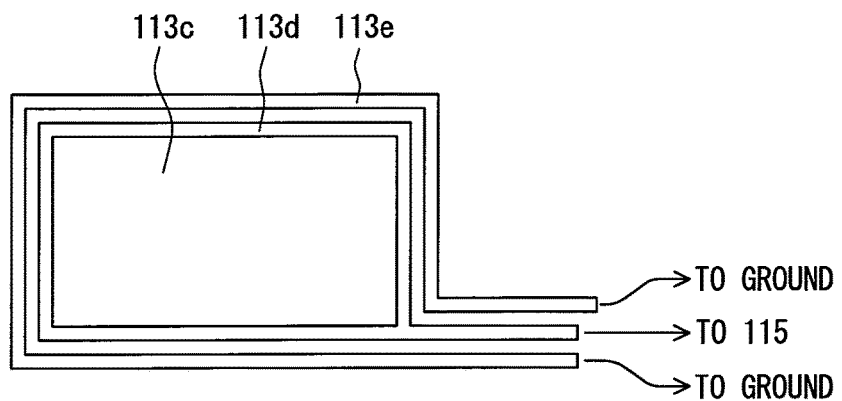
FIG. 6 is a plan view illustrating an electrode portion viewed from VI in FIG. 5.

As illustrated in FIGS. 4 through 6, the switch device 100 applied to the automobile navigation system 12 includes an input portion 110, a detection IC 120, a lighting LED 130, and a main unit 140.

The input portion 110 inputs a condition to operate the automobile navigation system 12 according to the driver's finger manipulation (touching a switch by the finger). The input portion 110 allows input to operate a navigation system, an audio system, a handsfree mobile telephone, or a radio set or input to display the driver-requested information on the display 12a. As illustrated in FIGS. 1 and 2, the input portion 110 is placed on the right and left sides of the display 12a. The switch device 100 on the right side differs from the switch device 100 on the left side in the number of switches and contents capable of input. However, the input portions 110 have basically the same structure. The following description refers to the input portion 110 on the right side in FIGS. 1 and 2.

As illustrated in FIG. 3, the input portion 110 includes switches 110a through 110f on the navigation panel 11a. The switches 110a through 110f correspond to the switch portions and are formed as capacitance switch portions. The switches 110a through 110f are arranged so that component members 111 through 113 (including a design portion 112a and an electrode portion 113c) overlap with each other, as will be described later. The switches 110a through 110f function as follows. The switch 110a inserts or ejects a music CD. The switch 110b sets the destination guidance. The switch 110c displays various types of vehicle information. The switch 110d displays the current position information on a map. The switch 110e specifies a destination. The switch 110f activates the handsfree mobile telephone function.

As illustrated in FIGS. 4 through 6, the switches 110a through 110f in the input portion 110 each include a panel 111, a decorative layer 112, an electrostatic switch sheet 113, a substrate 114, and a connector 115.

The panel (touch place) 111 is provided as a basic plate member for finger manipulation. The panel 111 is externally shaped into a flat plate-like member to match a designed shape. The panel 111 is formed of a translucent resin material.

An area around the switches 110a through 110f corresponds to a background of the decorative layer 112. An area corresponding to each of the switches 110a through 110f contains the design portion 112a formed to indicate the switch function. The design portion 112a contains a character or an icon. The decorative layer 112 is formed on the surface (top surface) of the panel 111 toward the driver. The decorative layer 112 is formed by a coating, a printed film, or a transfer foil. An L-shaped groove 111a is formed in the panel 111 and the decorative layer 112 to be peripherally positioned at the bottom and the right of each of the switches 110a through 110f.

As illustrated in FIG. 5, the electrostatic switch sheet 113 is a layer of a double-sided adhesive tape 113a, a base film 113b, an electrode portion 113c, wiring portions 113d and 113e, and an insulation protection layer 113f in order from the surface (rear surface) of the panel 111 opposite the driver to the inside (the bottom in FIG. 5). The double-sided adhesive tape 113a bonds the electrostatic switch sheet 113 to the rear surface of the panel 111.

The base film 113b uses a thin film member made of polyethylene terephthalate or polyimide. The double-sided adhesive tape 113a bonds the base film 113b to the rear surface of the panel 111.

A capacitor is formed between the electrode portion 113c and the driver's finger during manipulation via the panel 111 and the base film 113b. The electrode portion 113c is formed of a print material (ink or paste) containing metallic foil or conductive material (carbon, metal, or conductive polymer). The electrode portion 113c is bonded onto the base film 113b. The electrode portion 113c is provided for the base film 113b so as to overlap with the position of the design portion 112a corresponding to each of the switches 110a through 110f. According to the example, six electrode portions 113c are provided.

As illustrated in FIG. 6, the wiring portion 113d is provided around the electrode portion 113c and transmits a signal (capacitance-related) output from the electrode portion 113c. The wiring portion 113d is provided for each electrode portion 113c and is paired with the electrode portion 113c. Similarly to the electrode portion 113c, the wiring portion 113d is formed of a print material (ink or paste) containing metallic foil or conductive material (carbon, metal, or conductive polymer). The wiring portion 113d is bonded onto the base film 113b. An end is formed and provided for the wiring portion 113d so as to protrude from the periphery of the electrode portion 113c. Each end is connected to each connector 115 to be described later.

The wiring portion 113e is provided so as to surround the wiring portion 113d in the electrode portion 113c. The wiring portion 113e is provided for each electrode portion 113c and is paired with the electrode portion 113c. Similarly to the wiring portion 113d, the wiring portion 113e is formed of a print material (ink or paste) containing metallic foil or conductive material (carbon, metal, or conductive polymer). The wiring portion 113e is bonded onto the base film 113b. An end of each wiring portion 113e is grounded.

The insulation protection layer 113f is a thin member formed from an insulating material. The insulation protection layer 113f is provided so as to cover a surface of each of the electrode portions 113c and the wiring portions 113d and 113e to protect the electrode portions 113c and the wiring portions 113d and 113e.

The substrate 114 is a thin plate-like member on which surface an electric circuit is formed. The substrate 114 parallels the panel 111 to face each electrode portion 113c. One substrate 114 is provided for several (six) electrode portions 113c.

The connector 115 forms a connection portion to each electrode portion 113c. Several (six) connectors 115 are provided for the substrate 114 on its surface (opposite surface) opposite the electrode portions 113c so as to correspond to the electrode portions 113c. An end of the wiring portion 113d protrudes from each electrode portion 113c and is connected to each connector 115.

The detection IC 120 is connected to each connector 115 and provides a detection portion that detects a signal from each electrode portion 113c. One detection IC 120 is provided for the electrode portions 113c. The detection IC 120 is provided for the substrate on its opposite surface. The detection IC 120 detects signals from all the electrode portions 113c by sequentially detecting signals from the electrode portions 113c at a very short time interval.

Figure 7:
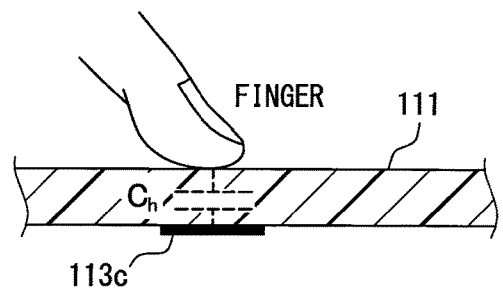
FIG. 7 is a sectional view illustrating the positional relationship between a user's finger and the electrode portion.
Figure 8:
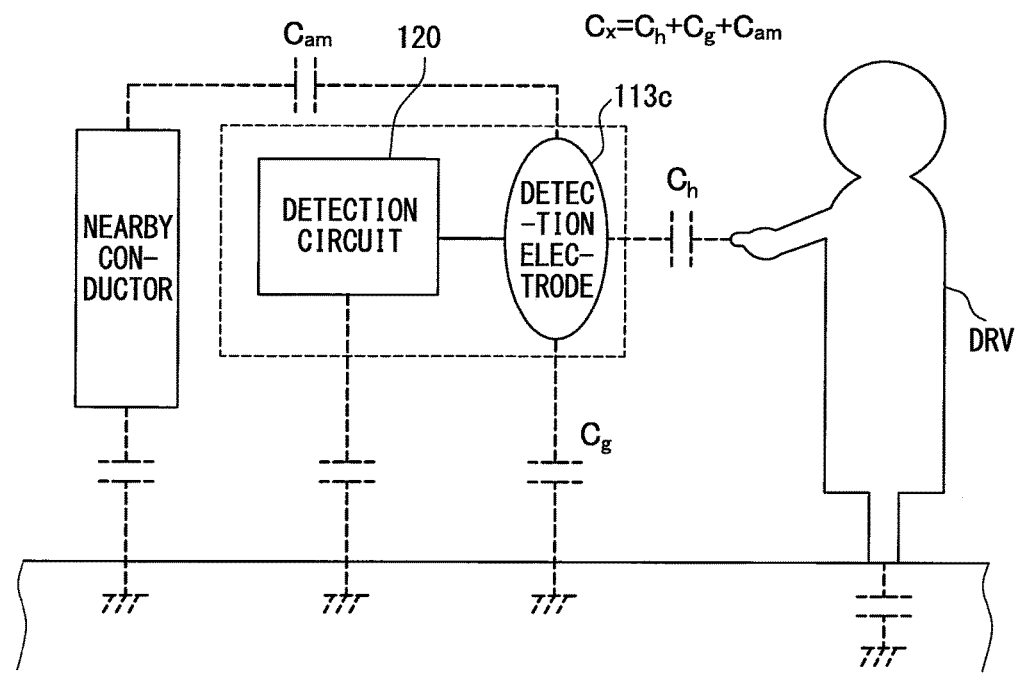
FIG. 8 is an explanatory diagram illustrating capacitance related to the electrode portion.

As illustrated in FIGS. 7 and 8, the electrode portion 113c generates capacitance Ch between the electrode portion 113c and a finger of a driver (DRV). The electrode portion 113c generates capacitance Cam between the electrode portion 113c and a nearby conductor. The electrode portion 113c generates capacitance Cg between the electrode portion 113c and the ground (earth). Suppose that capacitance Ch, Cam, and Cg total up to Cx. The detection IC 120 detects total capacitance Cx as a signal from the electrode portion 113c.

The lighting LED 130 provides a light source that irradiates the light to the design portion 112a corresponding to the electrode portion 113c. The lighting LED 130 provides a brightness adjustment portion that adjusts the brightness (illumination brightness) of the light irradiated to the design portion 112a. Several (six) lighting LEDs 130 are provided correspondingly to the design portions 112a (electrode portions 113c). The lighting LED 130 is provided for the substrate 114 on its opposite surface. Turning on the lighting LED 130 illuminates the design portion 112a.

When turned on, the lighting LED 130 is adjusted to enable the brightness in two levels. In the daytime (when the night illumination is not performed), the lighting LED 130 turns on to illuminate the design portion 112a at the first level under the brightness adjustment control to be described later. At nighttime (when the night illumination is performed), the lighting LED 130 turns on to illuminate the design portion 112a at the first level for night illumination. The lighting LED 130 then illuminates the design portion 112a more brightly at the second level under the brightness adjustment control to be described later.

Each design portion 112a may be provided with two lighting LEDs 130. The first level may be enabled by turning on only one lighting LED 130. The second level may be enabled by turning on two lighting LEDs 130 at the same time.

The main unit 140 receives a capacitance signal generated in the electrode portion 113c from the detection IC 120. The main unit 140 provides a control portion that performs display control over the display 12a of the automobile navigation system 12, operation control over functions, and the brightness adjustment control over the lighting LEDs 130. The main unit 140 connects with a light switch 150 that performs night illumination by turning on a headlamp or an auxiliary lamp of the vehicle. The main unit 140 can determine that turning off the light switch 150 (to input an off-signal) inactivates the night illumination and turning on the light switch 150 (to input an on-signal) activates the night illumination.

Figure 9:
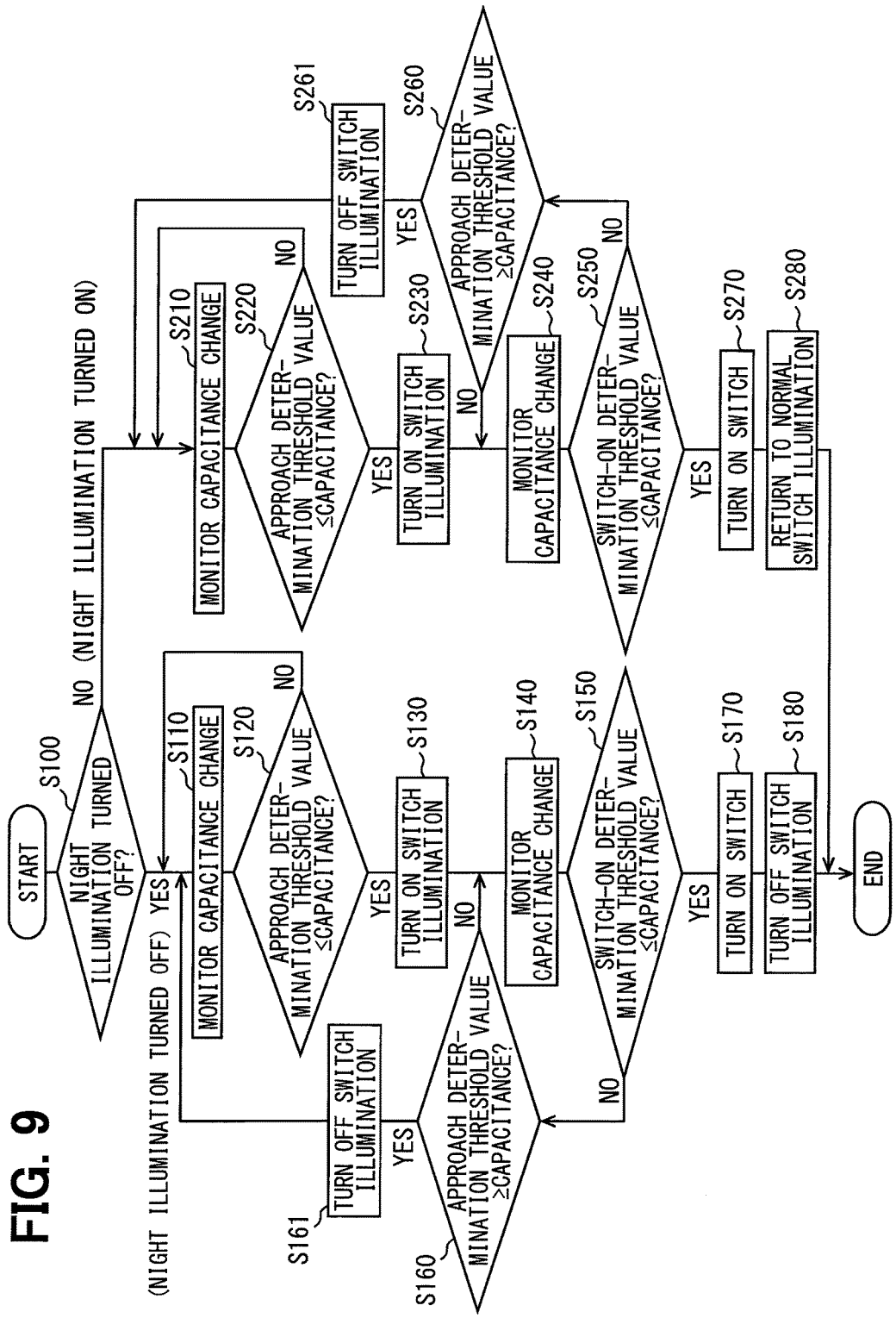
FIG. 9 is a flowchart illustrating brightness adjustment control performed by a main unit.
Figure 10:
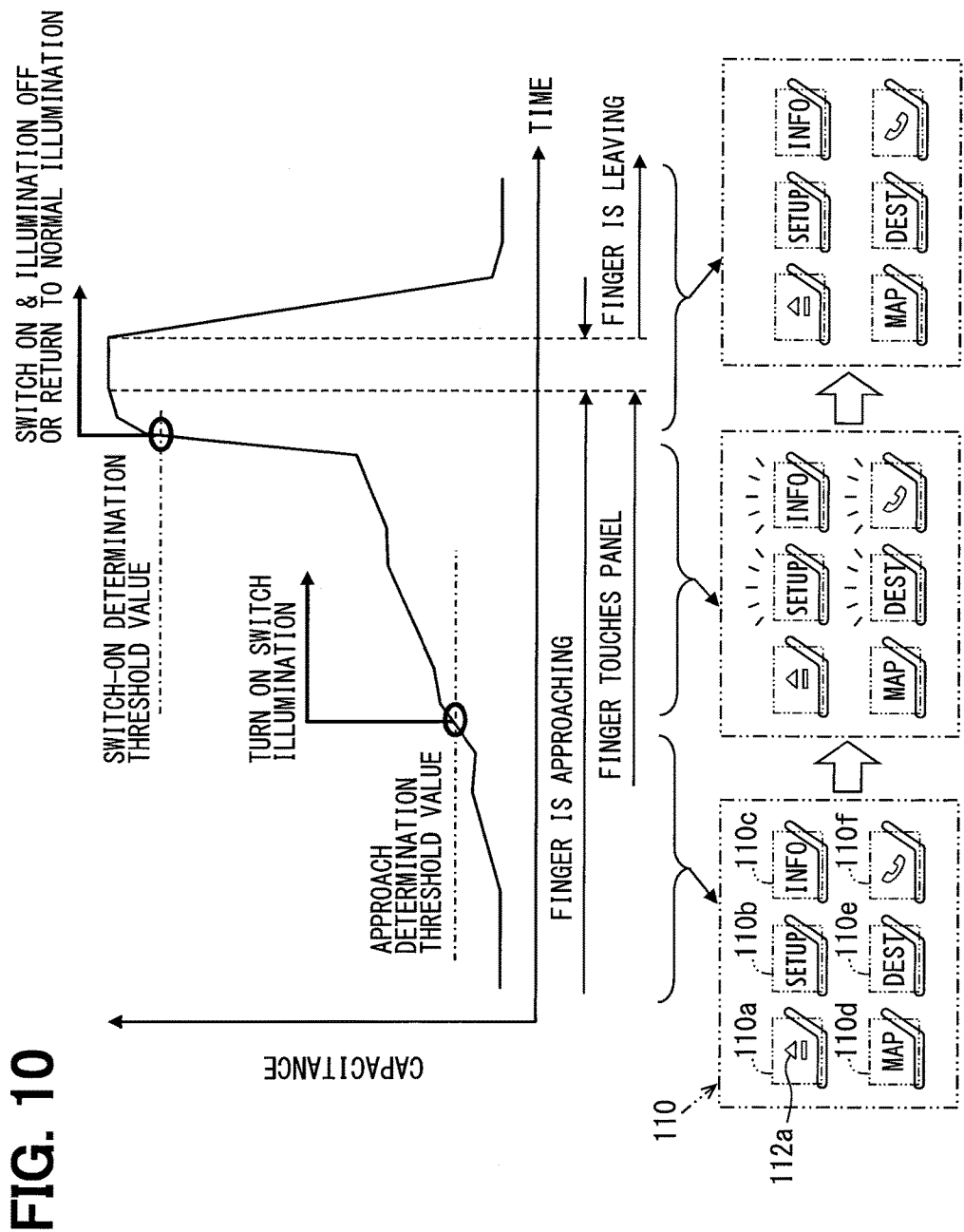
FIG. 10 is a timing diagram illustrating the brightness adjustment control performed by the main unit.

Also with reference to FIGS. 9 and 10, the following describes operation and function effects of the switch device 100 based on the configuration.

Suppose that the driver touches a targeted switch (one of 110a through 110f) to operate the automobile navigation system 12 while the vehicle stops or is traveling. In this case, a capacitor is formed between the electrode portion 113c corresponding to the position of the switch (e.g., 110c) touched by the finger and the finger as a conductive body to cause an electric charge. The detection IC 120 detects a capacitance change as a signal resulting from the electric charge via the wiring portion 113d and the connector 115. The detection IC 120 converts the detected signal into a specifically formatted signal and outputs the signal to the main unit 140.

Based on the output signal, the main unit 140 allows the display 12a to display the information requested by the driver or operates an instrument requested by the driver. The driver can view necessary information by changing screens or operate the targeted instrument by manipulating the switches 110a through 110f with his or her finger.

In the switch device 100 according to the embodiment, the main unit 140 performs the brightness adjustment control over the design portion 112a by turning on or off the lighting LED 130 when the driver attempts to select a targeted switch (one of 110a through 110f). The details follow.

At S100 of a flowchart in FIG. 9, the main unit 140 determines whether or not the night illumination currently turns off based on an off-signal or an on-signal from the light switch 150. If the determination at S100 is affirmed, the main unit 140 determines that the night illumination is not performed and all the lighting LEDs 130 are off.

The main unit 140 proceeds to S110 to monitor a capacitance change in the electrode portion 113c.

At S120, the main unit 140 determines whether or not the capacitance acquired from the electrode portion 113c is greater than or equal to a predetermined approach determination threshold value. The approach determination threshold value is used to determine that the driver's finger approaches the area where the switches 110a through 110f are provided. The threshold value can be used to detect an approach state of approximately five centimeters depending on the magnitude of the resulting capacitance.

The main unit 140 repeats S110 and S120 if the determination at S120 is negated. The main unit 140 proceeds to S130 if the determination at S120 is affirmed, namely, if the driver's finger is assumed to approach the area for the switches 110a through 110f as specified.

At S130, the main unit 140 turns on (first level) the lighting LEDs 130 corresponding to all the electrode portions 113c that generate the capacitance in excess of the approach determination threshold value. In this case, the brightness is high enough to fully recognize the targeted design portion 112a in the daytime. As illustrated in FIG. 10, the approach determination threshold value indicates that the driver's finger approaches the switches 110b, 110c, 110e, and 110f out of the switches 110a through 110f. The main unit 140 then turns on the lighting LEDs 130 corresponding to the four switches 110b, 110c, 110e, and 110f. In the embodiment, turning on the lighting LED 130 signifies allowing the brightness adjustment portion to increase the brightness of the design portion 112a in comparison with the original brightness of the design portion or increasing the illumination brightness of the design portion 112a. In this context, the light-on condition at the first level corresponds to the increased brightness. The light-off condition corresponds to the original brightness.

At S140 similarly to S110, the main unit 140 monitors a capacitance change in the electrode portion 113c.

At S150, the main unit 140 determines whether or not the capacitance acquired from the electrode portion 113c is greater than or equal to a predetermined switch-on determination threshold value. The switch-on determination threshold value is greater than the approach determination threshold value and is used to determine that the driver's finger approaches a targeted switch (e.g., 110c). The switch-on determination threshold value can be used to detect an approach state of approximately three to ten millimeters or a contact state of the finger with the switch depending on the magnitude of the resulting capacitance.

If the determination at S150 is negated, the main unit 140 proceeds to S160 to determine whether or not the capacitance acquired from the electrode portion 113c is smaller than or equal to the predetermined approach determination threshold value. If the determination at S160 is affirmed, the main unit 140 proceeds to S161 to turn off the lighting LED 130 activated at S130 and returns to S110. If the determination at S160 is negated, the main unit 140 returns to S140.

At S110 through 160, the capacitance acquired from the electrode portion 113c may be greater than the approach determination threshold value and may be smaller than the switch-on determination threshold value. In this case, all the lighting LEDs 130 corresponding to the electrode portions enter the light-on condition (first level) and the light-on condition is maintained. The capacitance acquired from the electrode portion 113c may be smaller than the approach determination threshold value. In this case, the lighting LED 130 corresponding to the electrode portion turns off.

If the determination at S150 is affirmed, the main unit 140 proceeds to S170 to activate the switch function corresponding to a switch that is determined to satisfy the approach determination according to the switch-on determination threshold value. The main unit 140 operates an instrument corresponding to this switch. Suppose that the switch 110c is assumed to satisfy the approach determination according to the switch-on determination threshold value. In this case, the display 12a displays various types of vehicle information.

After the switch function is activated (or after a lapse of a specified time period), the main unit 140 proceeds to S180 to turn off all the lighting LEDs 130 that are turned on at S130. In the embodiment, turning off the lighting LED 130 signifies returning the brightness increased by the brightness adjustment portion to the original brightness.

The determination at S100 may be negated to determine that the night illumination turns on during nighttime operation. In this case, the main unit 140 proceeds to S210 through S280 under the condition of the night illumination turned on and performs the control similar to S110 through S180. Turning on the night illumination signifies turning on the lighting LED 130 at the first level. At S210 through S280, the light-on condition at the first level corresponding to the original brightness.

At S210, the main unit 140 monitors a capacitance change in the electrode portion 113c.

At S220, the main unit 140 determines whether or not the capacitance acquired from the electrode portion 113c is greater than the approach determination threshold value. If the determination at S220 is negated, the main unit 140 repeats S210 and S220.

The main unit 140 proceeds to S230 if the determination at S220 is affirmed, namely, the driver's finger approaches the area for the switches 110a through 110f as specified.

At S230, the main unit 140 turns on the lighting LEDs 130 (second level) corresponding to all the electrode portions 113c that generated the capacitance in excess of the approach determination threshold value. The main unit 140 increases the brightness of the design portion 112a to be higher than the original brightness. In this case, the targeted design portion 112a provides the brightness higher than the normal night illumination.

At S240, similarly to S210, the main unit 140 monitors a capacitance change in the electrode portion 113c.

At S250, the main unit 140 determines whether or not the capacitance acquired from the electrode portion 113c is greater than the switch-on determination threshold value. If the determination at S250 is negated, the main unit 140 proceeds to S260 to determine whether or not the capacitance acquired from the electrode portion 113c is smaller than the approach determination threshold value. If the determination at S260 is affirmed, the main unit 140 proceeds to S261 to turn off the lighting LED 130 turned on at S230 and returns to S210. The main unit 140 returns to S240 if the determination at S260 is negated.

At S210 through 261, the capacitance acquired from the electrode portion 113c may be greater than the approach determination threshold value and may be smaller than the switch-on determination threshold value. In this case, all the lighting LEDs 130 corresponding to the electrode portions enter the light-on condition (second level) and the light-on condition is maintained. The capacitance acquired from the electrode portion 113c may be smaller than the approach determination threshold value. In this case, the lighting LED 130 corresponding to the electrode portion returns to the original light-on condition (first level).

If the determination at S250 is affirmed, the main unit 140 proceeds to S270 to activate the switch function corresponding to a switch that is determined to satisfy the approach determination according to the switch-on determination threshold value. The main unit 140 operates an instrument corresponding to this switch. Suppose that the switch 110c is assumed to satisfy the approach determination according to the switch-on determination threshold value. In this case, the display 12a displays various types of vehicle information.

After the switch function is activated (or after a lapse of a specified time period), the main unit 140 proceeds to S280 to return the brightness of all the lighting LEDs 130 turned on at S230 (second level) to the original brightness (first level).

As described with reference to FIGS. 9 and 10, the main unit 140 according to the embodiment performs the brightness adjustment control over the design portion 112a based on the driver's finger manipulation while the vehicle stops or is traveling.

An approach of the driver's finger to the electrode portions 113c increases the brightness of the design portions 112a corresponding to all the electrode portions 113c whose capacitance exceeds the approach determination threshold value. The driver can first recognize an area of the switches 110a through 110f to be manipulated. The driver can then easily recognize a targeted one (e.g., 110c) of the switches. The driver can be effectively guided to select a targeted switch.

The driver may have inadvertently selected the incorrect switch (110c) and need to select another switch. Even in such a case, an approach of the finger to the electrode portions 113c maintains the brightness of the lighting LED 130 when the capacitance exceeds the approach determination threshold value and falls short of the switch-on determination threshold value. The driver can be effectively guided to newly select another switch.

The main unit 140 turns on the switch (e.g., 110c) corresponding to the electrode portion 113c whose capacitance exceeds the switch-on determination threshold value. The brightness of the design portion 112a returns to the original brightness after the automobile navigation system 12 is operated. The design portion 112a does not remain obtrusive to the driver. The driver can recognize that the automobile navigation system 12 operates normally.

Second Embodiment

Figure 11:
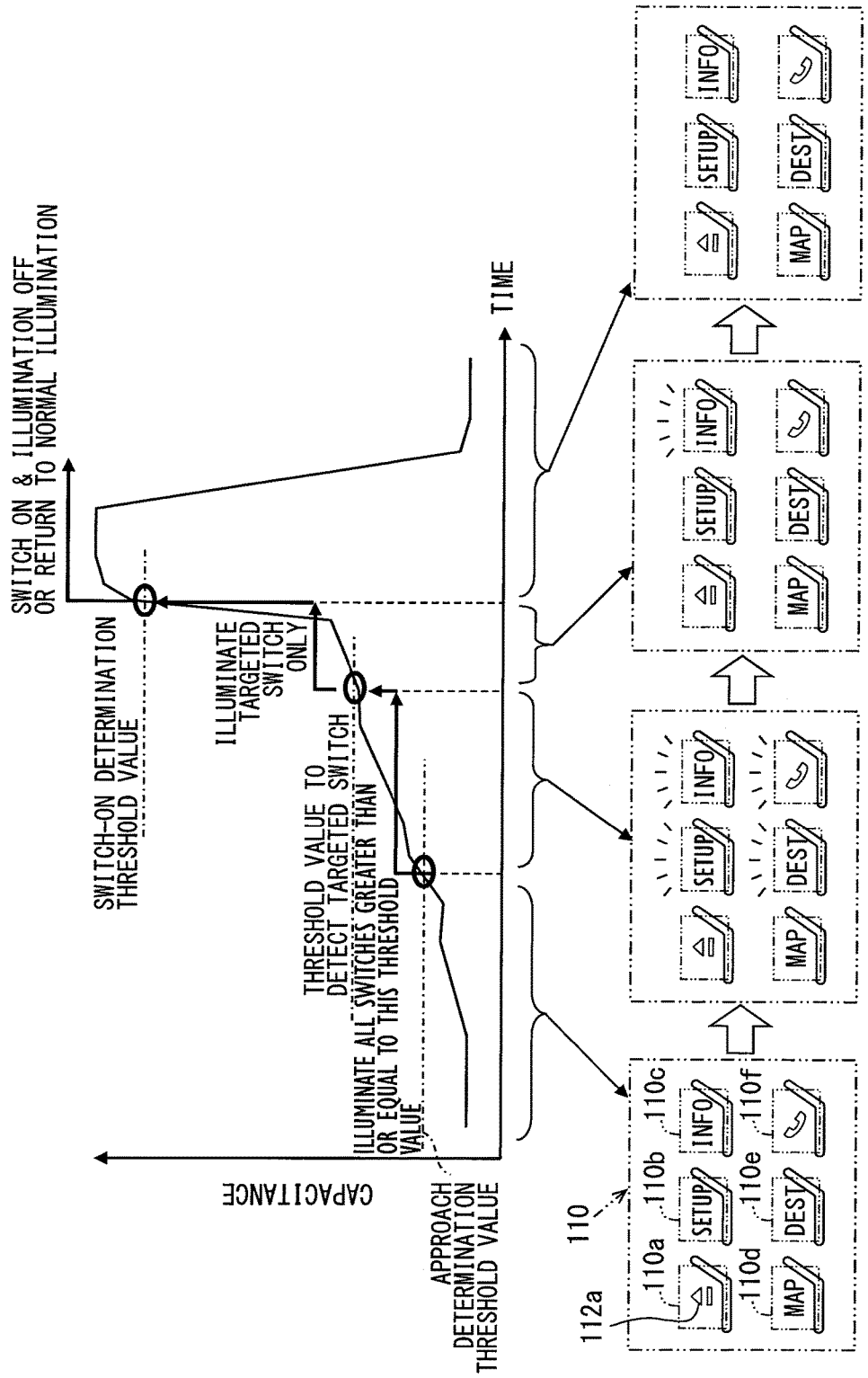
FIG. 11 is a timing diagram illustrating the brightness adjustment control according to a second embodiment.

FIG. 11 illustrates the brightness adjustment control according to the second embodiment. The configuration of the switch device 100 according to the second embodiment equals the first embodiment. Further, a target switch detection threshold value is provided between the approach determination threshold value and the switch-on determination threshold value described in the first embodiment. According to the second embodiment, the approach determination threshold value corresponds to a first approach determination threshold value. The target switch detection threshold value corresponds to a second approach determination threshold value.

According to the embodiment, the main unit 140 turns on the lighting LEDs 130 corresponding to all the electrode portions 113c whose capacitance exceeds the approach determination threshold value in response to the driver's finger manipulation. The capacitance is acquired from each electrode portion 113c. For example, the main unit 140 turns on the lighting LEDs 130 corresponding to the switches 110b, 110c, 110e, and 110f.

When the driver's finger further approaches any of the switches, the main unit 140 turns on the lighting LEDs 130 corresponding to all the electrode portions 113c whose capacitance exceeds the target switch detection threshold value. The capacitance is acquired from each electrode portion 113c. When the finger further approaches the switch 110c, the main unit 140 turns on the lighting LED 130 corresponding to the switch 110c. The light-on condition (turning on four lighting LEDs) based on the approach determination threshold value changes to the light-on condition (turning on one lighting LED) based on the target switch detection threshold value.

The main unit 140 turns on the switch (e.g., 110c) corresponding to the electrode portion 113c whose capacitance exceeds the switch-on determination threshold value to operate the automobile navigation system 12. The capacitance is acquired from each electrode portion 113c. The main unit 140 changes the light-on condition based on the target switch detection threshold value to the light-off condition.

The brightness of the design portion 112a is increased based on the approach determination threshold value. The brightness is further increased based on the target switch detection threshold value so as to locate the specific design portion 112a. The driver can be more effectively guided to select a targeted switch (110c).

Third Embodiment

Figure 12:
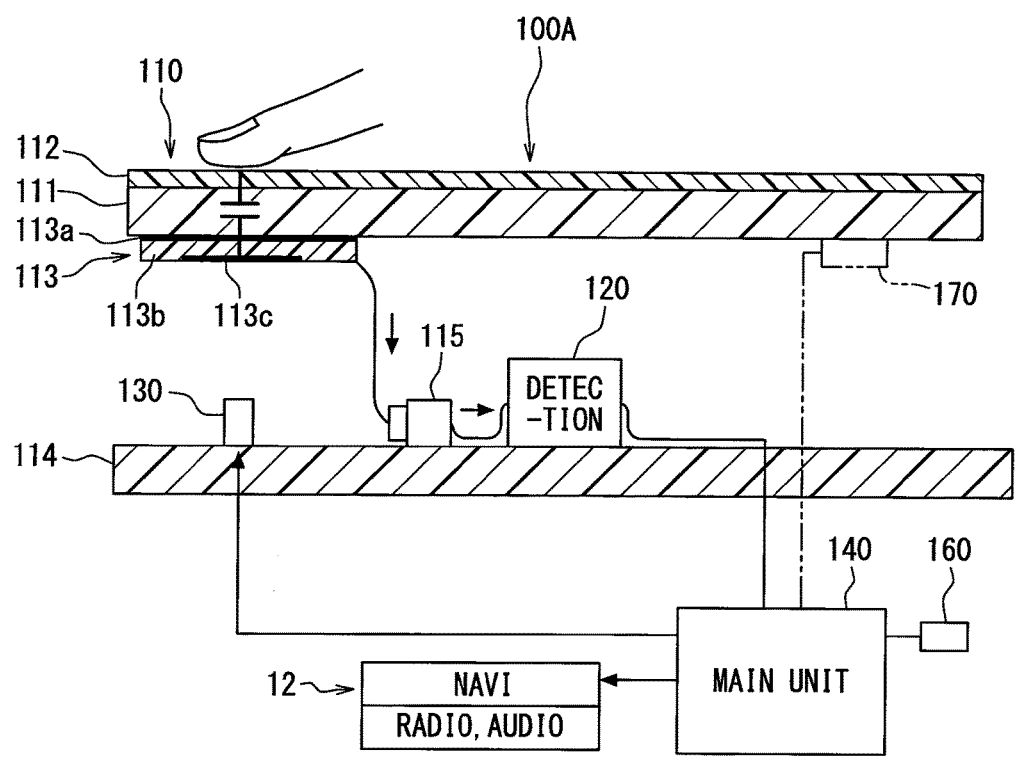
FIG. 12 is a sectional view illustrating a switch device for a vehicle according to a third embodiment.
Figure 13:
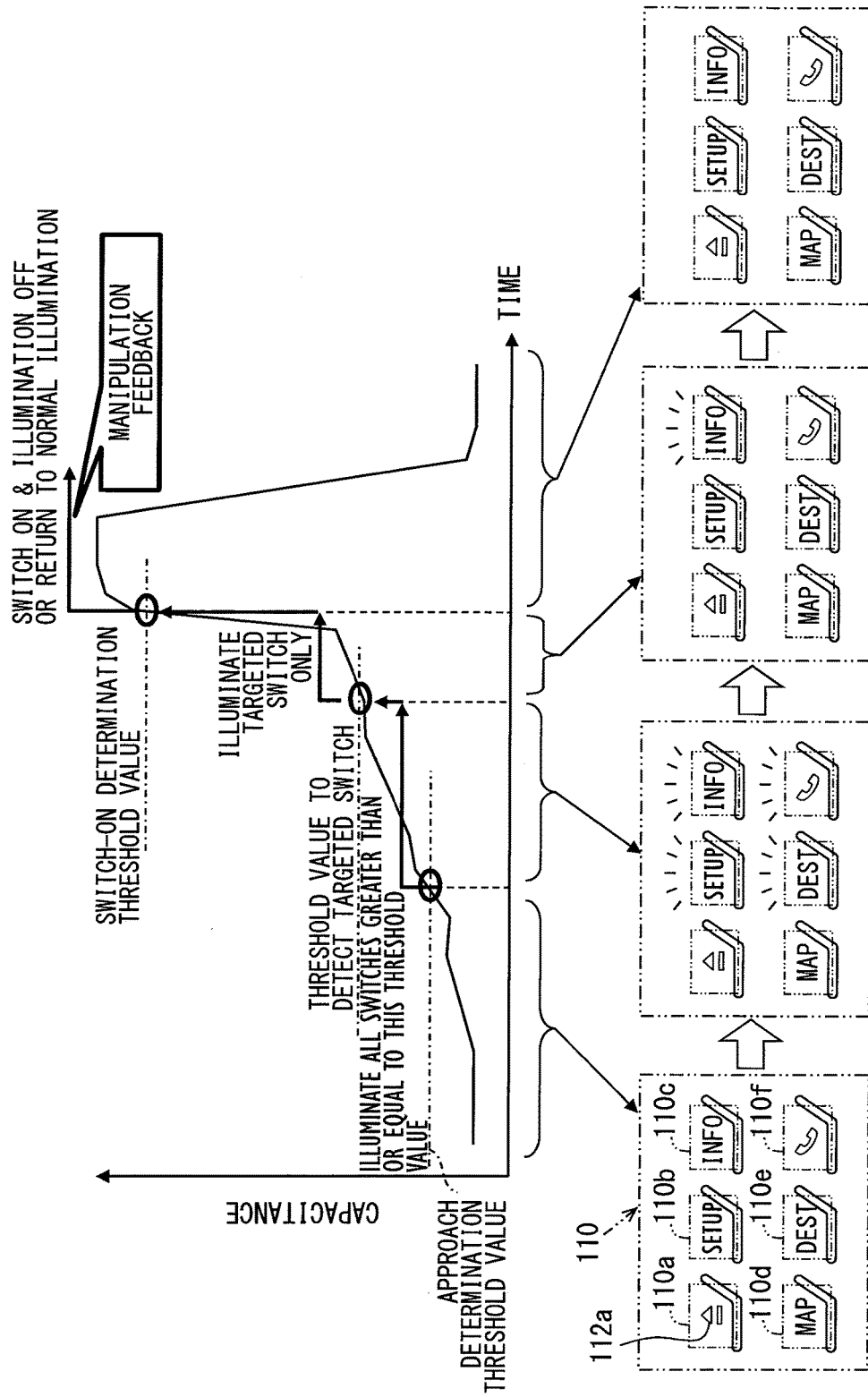
FIG. 13 is a timing diagram illustrating the brightness adjustment control according to a third embodiment.

FIG. 12 illustrates a switch device 100A according to the third embodiment. FIG. 13 illustrates the brightness adjustment control. Compared to the second embodiment, the third embodiment provides a recognition portion (manipulation feedback means) to notify the driver of activation of the switch that satisfies the approach determination indicated by the switch-on determination threshold value.

As illustrated in FIG. 12, the recognition portion is provided as a buzzer 160 (sound generator) that beeps. The main unit 140 controls whether or not to generate the sound. The buzzer 160 may be replaced by the audio feature of the automobile navigation system 12.

As illustrated in FIG. 13, the main unit 140 performs the brightness adjustment control described in the second embodiment and operates the buzzer 160 while activating the switch function corresponding to the switch to satisfy the approach determination indicated by the switch-on determination threshold value and returning the brightness of the lighting LED 130 to the original brightness. The buzzer sound allows the driver to recognize that the switch is turned on. The buzzer 160 may operate simultaneously with the time to activate the switch function or after a specified time period elapsed from the time to activate the switch function.

The driver can clearly recognize that the selected switch operates the targeted instrument.

The buzzer 160 or the audio feature as the recognition portion may be replaced by a vibration element 170 (vibrator) that is provided for the panel 111 and generates vibration under control of the main unit 140.

The recognition portion may be provided as a combination of the buzzer 160 and the vibration element 170, namely, a combination of the sound and the vibration.

The recognition portion may further increase the brightness (higher than the original brightness) and provides the high brightness for a switch that satisfies the approach determination indicated by the switch-on determination threshold value.

The recognition portion may be a portion (blinking device) tha blinks the light-on condition of a switch that satisfies the approach determination indicated by the switch-on determination threshold value.

The recognition portion may be provided as a combination of at least two of the sound generator, the vibrator, the device to further increase the brightness, and the blinking device.

While there has been described the recognition portion as being applied to the second embodiment, the recognition portion may be applied to the first embodiment.

Fourth Embodiment

Figure 14:
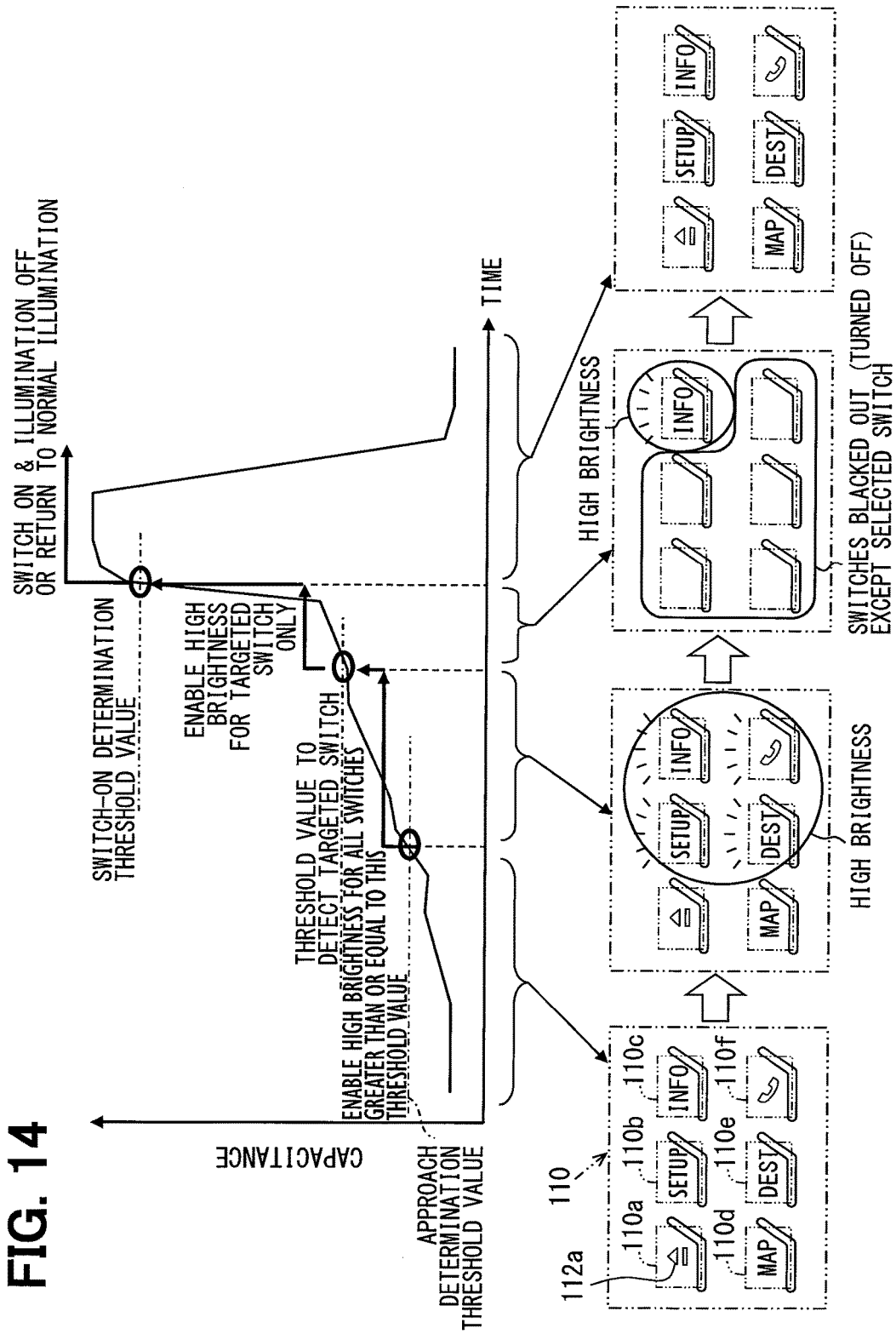
FIG. 14 is a timing diagram illustrating the brightness adjustment control according to a fourth embodiment.

FIG. 14 illustrates the brightness adjustment control according to the fourth embodiment. The configuration of the switch device 100 according to the fourth embodiment equals the second embodiment. Each of the switches 110a through 110f is provided as a blackout switch and uses a smoked filter corresponding to the design or the character. This prevents visual identification of the design or the character for each of the switches 110a through 110f when an ignition switch of the vehicle is turned off to turn off the lighting LED 130 as an illumination light source. Turning on the ignition switch turns on all the lighting LEDs 130. This illuminates the design portion 112a of each of the switches 110a through 110f so that the switches 110a through 110f can be recognized. Turning on the ignition switch turns on the lighting LED 130 (first level). The brightness of the lighting LED 130 at this time is defined as the original brightness.

According to the embodiment, the capacitance results from each electrode portion 113c based on the driver's finger manipulation. The main unit 140 increases the brightness of the lighting LED 130 corresponding to all the electrode portions 113c whose capacitance exceeds the approach determination threshold value. The increased brightness (high brightness) is higher than the original brightness. For example, the main unit 140 increases the brightness of the lighting LEDs 130 corresponding to the switches 110b, 110c, 110e, and 110f.

When the driver's finger further approaches any of the switches, the main unit 140 maintains the increased brightness (high brightness) of the lighting LED 130 (e.g., the brightness of the switch 110c) corresponding to all the electrode portions 113c whose capacitance exceeds the target switch detection threshold value. The capacitance is acquired from each electrode portion 113c. The increased brightness is based on the approach determination threshold value. However, the other lighting LEDs 130 are all turned off. Namely, the switches (e.g., 110a, 110b, 1210d, 110e, and 110f) corresponding to the other lighting LEDs 130 are turned off and in black-out states.

The main unit 140 turns on the switch (e.g., 110c) corresponding to the electrode portion 113c whose capacitance exceeds the switch-on determination threshold value to operate the automobile navigation system 12. The capacitance is acquired from each electrode portion 113c. The main unit 140 returns the brightness of the lighting LEDs 130 corresponding to all the switches 110a through 110f to the original brightness (first level).

The blackout switch can provide the same operation and effect as the second embodiment.

Fifth Embodiment

Figure 15:
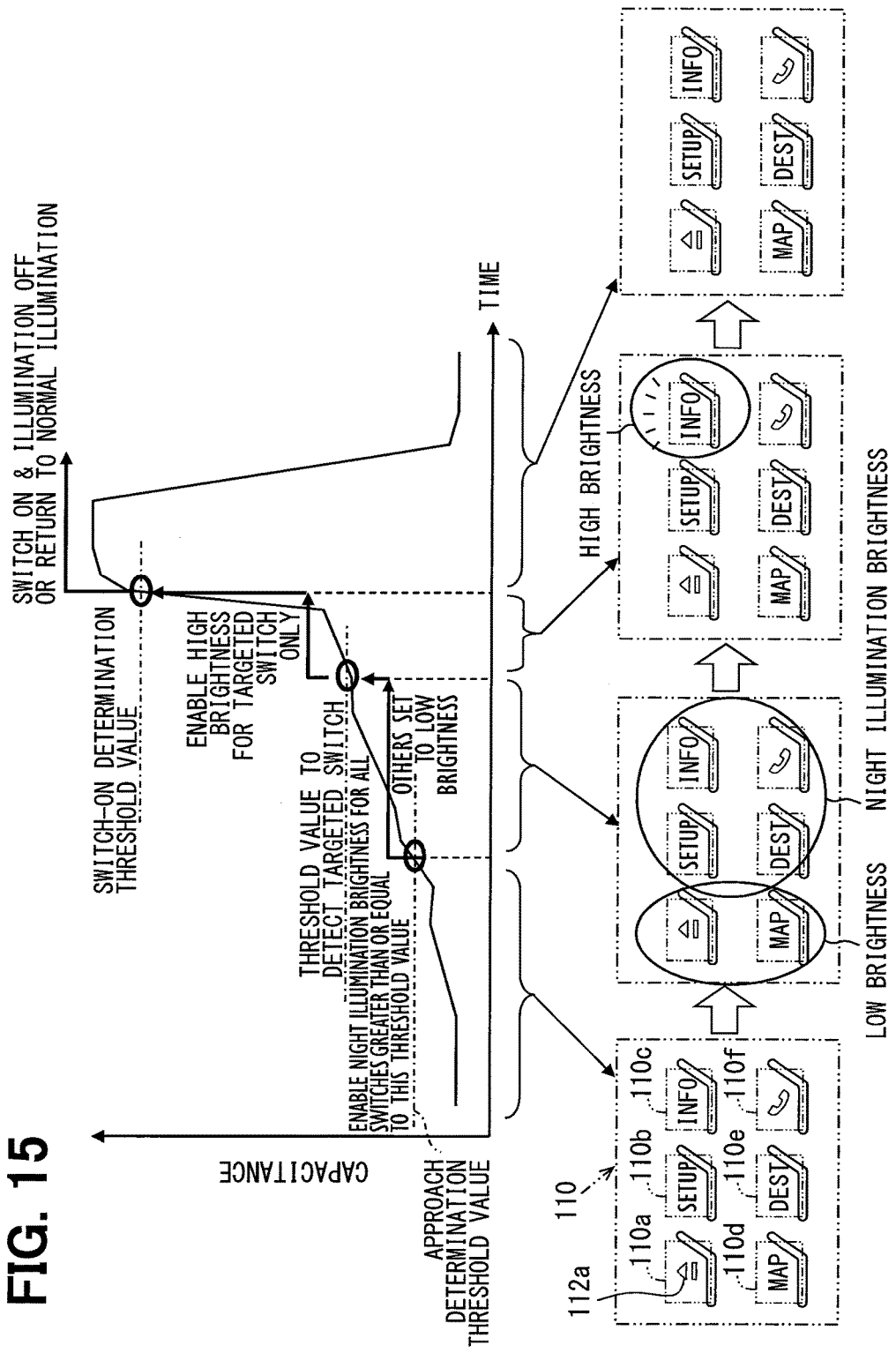
FIG. 15 is a timing diagram illustrating the brightness adjustment control according to a fifth embodiment.

FIG. 15 illustrates the brightness adjustment control according to the fifth embodiment. The configuration of the switch device 100 according to the fourth embodiment equals the second embodiment. At nighttime, the lighting LED 130 turns on (first level) to enable the night illumination for the switches 110a through 110f (night illumination brightness). The brightness of the lighting LED 130 at the first level is defined as the original brightness.

When the night illumination is performed according to the embodiment, the capacitance is acquired from each electrode portion 113c in response to the driver's finger manipulation. The capacitance of the electrode portion 113c may exceed the approach determination threshold value. The brightness of the lighting LEDs 130 (e.g., switches 110a and 110d) corresponding to the other electrode portions 113c is changed to the brightness (low brightness) lower than the first-level brightness (night illumination brightness). The night illumination brightness is maintained for the lighting LEDs 130 (e.g., the switches 110b, 110c, 110e, and 110f) corresponding to all the electrode portions 113c whose capacitance exceeds the approach determination threshold value.

When the driver's finger further approaches any of the switches, the main unit 140 maintains the increased brightness (high brightness) of the lighting LED 130 (e.g., the switch 110c) corresponding to all the electrode portions 113c whose capacitance exceeds the target switch detection threshold value. The capacitance is acquired from each electrode portion 113c. The increased brightness is higher than the original night illumination brightness. The night illumination brightness is maintained for the remaining lighting LEDs 130 (e.g., the switches 110a, 110b, 110d, 110e, and 110f).

The main unit 140 turns on the switch (e.g., 110c) corresponding to the electrode portion 113c whose capacitance exceeds the switch-on determination threshold value to operate the automobile navigation system 12. The capacitance is acquired from each electrode portion 113c. The main unit 140 returns the brightness of the lighting LED 130 corresponding to all the switches 110a through 110f to the original brightness (the night illumination brightness at the first level).

Performing the night illumination on the switches 110a through 110f can provide the same operation and effect as the second embodiment.

Sixth Embodiment

Figure 16:
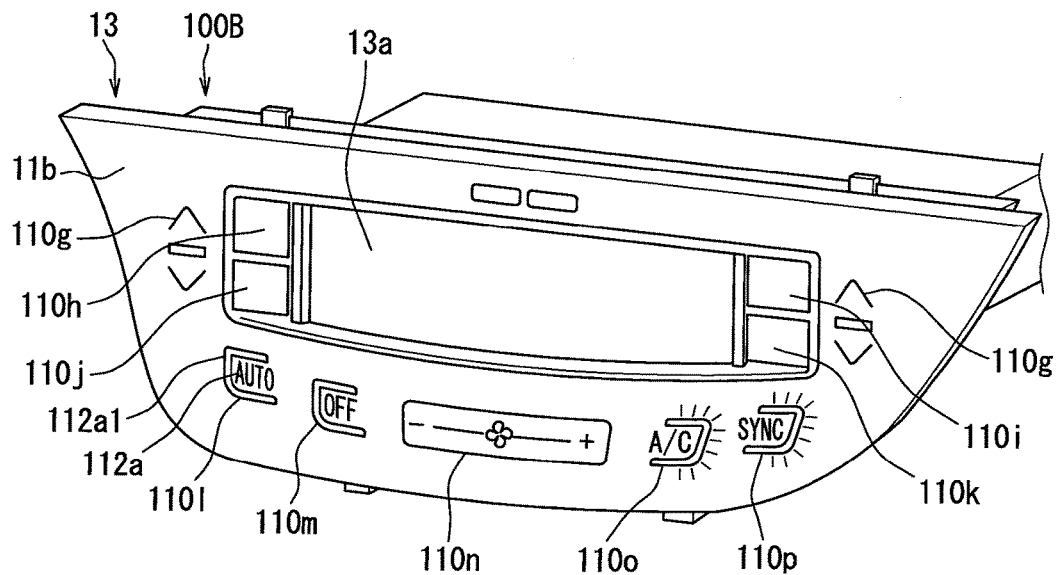
FIG. 16 is a perspective view illustrating a switch device according to a sixth embodiment.

FIG. 16 illustrates a switch device 100B according to the sixth embodiment. The switch device 100B inputs various conditions to operate a vehicular air conditioner 13.

The switch device 100B is provided for an air-conditioner panel positioned below the automobile navigation system 12. A display 13a is provided at the center of the air-conditioner panel 11b to display an operation state of the air conditioner 13. The display 13a corresponds to a display portion.

The design portion 112a and the electrode portion 113c form switches 110g through 110p provided around the display 13a. The switches 110g through 110p are defined as a temperature setup switch 110g, a front defroster switch 110h, a rear defroster switch 110i, a mode selector switch 110j, a recirculation mode switch 110k, an auto switch 110l, a fan-off switch 110m, an air flow rate switch 110n, an air conditioner switch 110o, and a dual switch 110p.

The embodiment changes the area whose brightness is adjusted under the brightness adjustment control performed by the main unit 140 over the design portion 112a. The first through fifth embodiments use a character or an icon to indicate the switch function of each design portion 112a. In addition to the character or the icon, the sixth embodiment uses a squared horseshoe-shaped frame 112a1 around the design portion 112a. The brightness adjustment control adjusts the brightness of the frame 112a1 instead of the character or the icon. The brightness adjustment control adjusts at least part of the area of the design portion 112a (the character and the icon or the frame 112a1). FIG. 16 illustrates adjustment of the brightness of the frame 112a1 for the switches 110o and 110p.

This can flexibly configure an area whose brightness is increased, based on the shape or the size of the design portion 112a or an effect on the driver's recognition.

Seventh Embodiment

Figure 17:
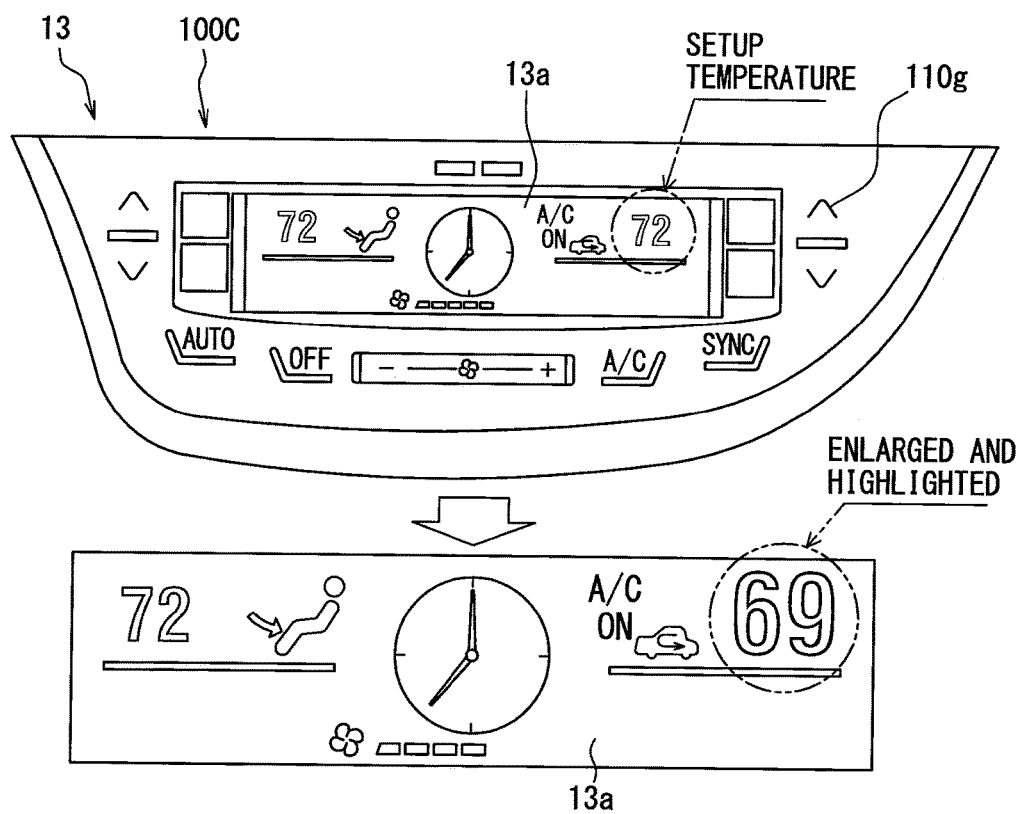
FIG. 17 is a front view illustrating a switch device according to a seventh embodiment.
Figure 18:
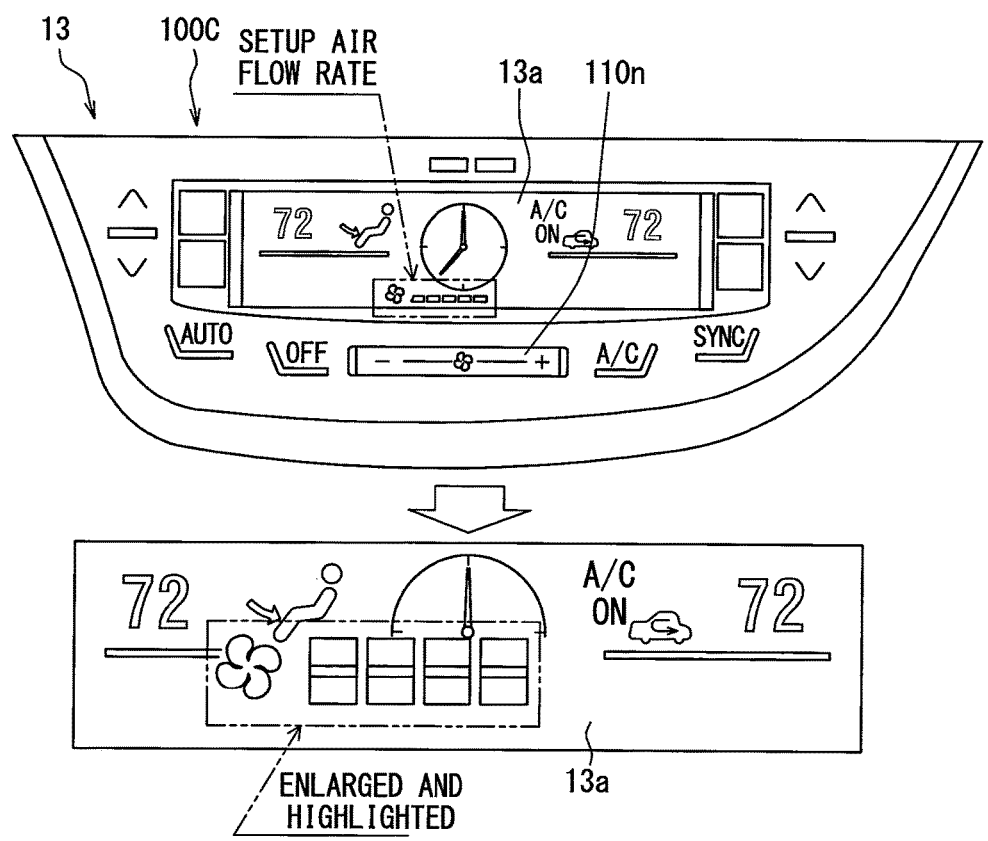
FIG. 18 is a front view illustrating a switch device according to a seventh embodiment.

FIGS. 17 and 18 illustrate a switch device 100C according to the seventh embodiment. Unlike the first through sixth embodiment, the switch device 100C according to the seventh embodiment uses a highlight display when the capacitance acquired from each electrode portion 113c exceeds the switch-on determination threshold value. The highlight display highlights a display related to the operation state of the display 13a corresponding to the switch for the electrode portion 113c.

As illustrated in FIG. 17, the display 13a displays a numeric value (72 degrees Fahrenheit) for the previously specified temperature. An input manipulation on the temperature setup switch 110g changes the setup temperature to another (69 degrees Fahrenheit) based on the switch-on determination threshold value. The changed temperature value is displayed in an enlarged and highlighted manner for a specified time period after the input manipulation.

As illustrated in FIG. 18, the display 13a displays a previously specified air flow level using a horizontal bar chart. An input manipulation on the air flow rate switch 110n changes the air flow rate based on the switch-on determination threshold value. A bar chart representing the change air flow level is displayed in an enlarged and highlighted manner for a specified time period after the input manipulation.

The highlight display of the display 13a enables the driver to clearly recognize the manipulation of the targeted switches 110g and 110n.

Eighth Embodiment

Figure 19:
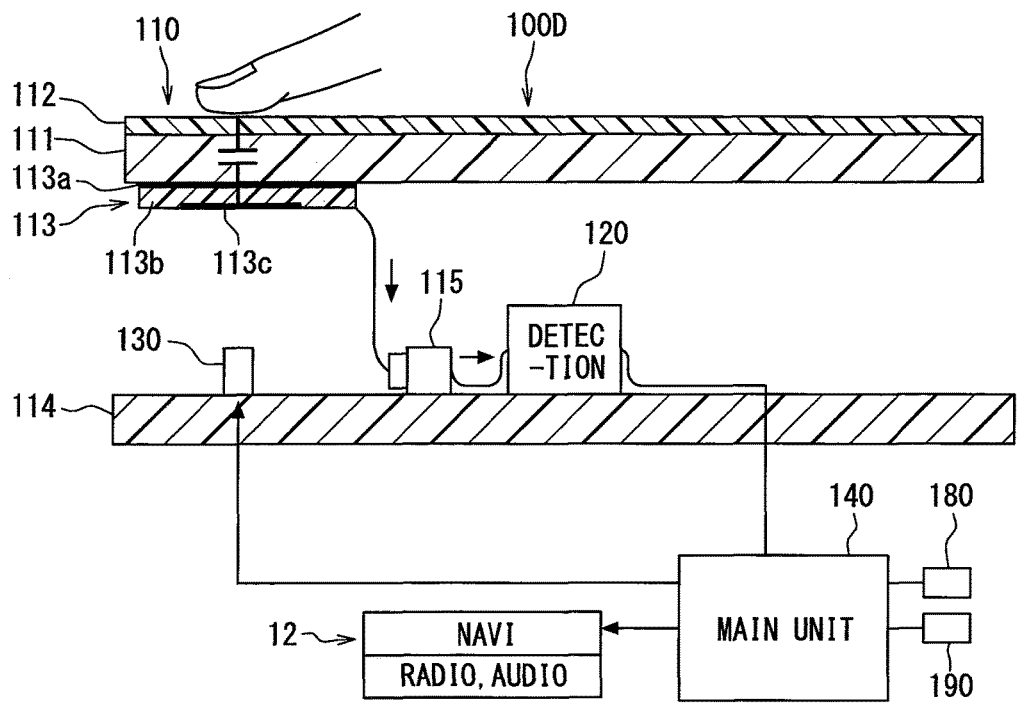
FIG. 19 is a sectional view illustrating a switch device for a vehicle according to an eighth embodiment.

FIG. 19 illustrates a switch device 100D according to the eighth embodiment. According to the first through seventh embodiments, the brightness adjustment control is performed regardless of whether the vehicle stops or is traveling. According to the eighth embodiment, however, the main unit 140 performs the brightness adjustment control when the vehicle stops. A state in which the vehicle stops signifies that a vehicle stops in a parking area or an idle-stop vehicle stops the engine while waiting for a traffic light.

The main unit 140 of the switch device 100D is supplied with a speed signal from a vehicle speed sensor 180 and a brake operation signal from a parking brake 190. The main unit 140 determines whether or not the vehicle stops, based on the vehicle speed signal and the brake operation signal. The main unit 140 performs the brightness adjustment control when determining that the vehicle stops.

There is no need for manipulation related to vehicle driving while the vehicle stops. The driver can manipulate switches (110a through 110f or 110g through 110p) while viewing a variation in the brightness of the design portion 112a. The guidance effect based on the brightness adjustment control can be fully exerted.

Ninth Embodiment

Figure 20:
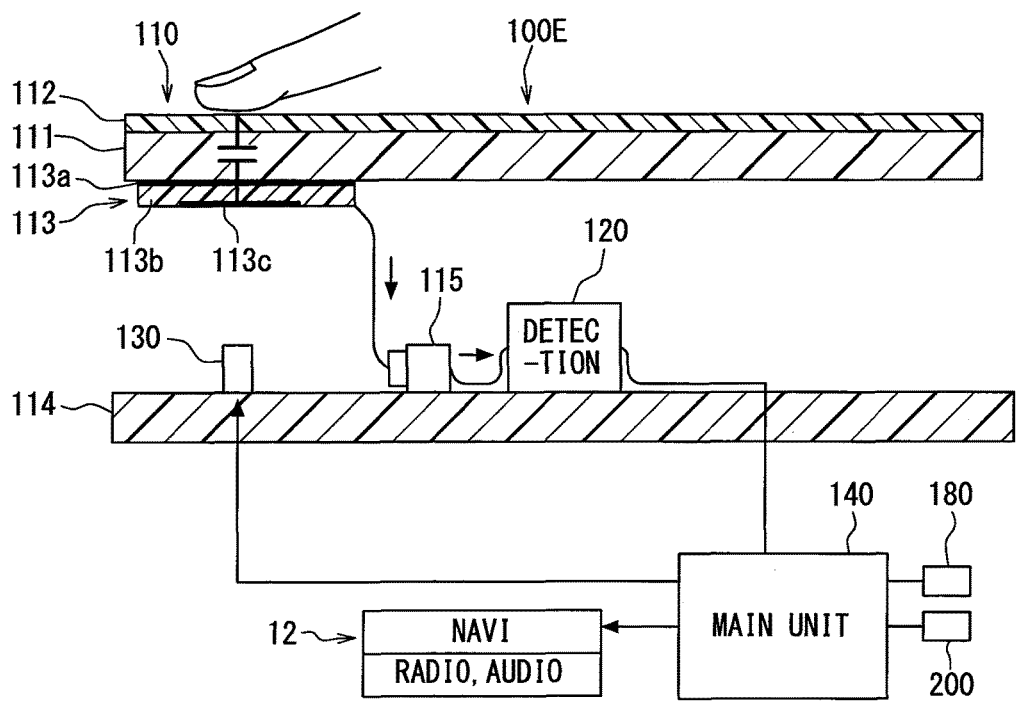
FIG. 20 is a sectional view illustrating a switch device for a vehicle according to a ninth embodiment.

FIG. 20 illustrates a switch device 100E according to the ninth embodiment. The switch device 100E according to the ninth embodiment includes a speed setup input portion 200 and a vehicle speed sensor 180 to determine whether or not the main unit 140 can perform the brightness adjustment control depending on vehicle speeds.

The speed setup input portion 200 provides a setup portion that enables the driver to set a speed range capable of performing the brightness adjustment control. The speed setup input portion 200 enables to set a speed condition (speed range) capable of performing the brightness adjustment control such as a vehicle speed of 0 km or lower or 20 km or lower according to driver's preference. The speed condition set by the driver is input to the main unit 140. The vehicle speed sensor 180 inputs a vehicle speed signal to the main unit 140.

The main unit 140 performs the brightness adjustment control under the specified speed condition while an actual vehicle speed value varies with the vehicle travel.

When the vehicle speed is higher than a specified speed, the driver needs to concentrate harder on the driving manipulation and cannot carefully watch the design portion 112a. The driver decreases the need for the brightness adjustment control by manipulating the switches 110a through 110f. A sense of speed varies from one driver to another.

The usability of the brightness adjustment control can be improved by using the speed setup input portion 200 to set a speed condition capable of performing the brightness adjustment control according to driver's preference.

Tenth Embodiment

Figure 21:
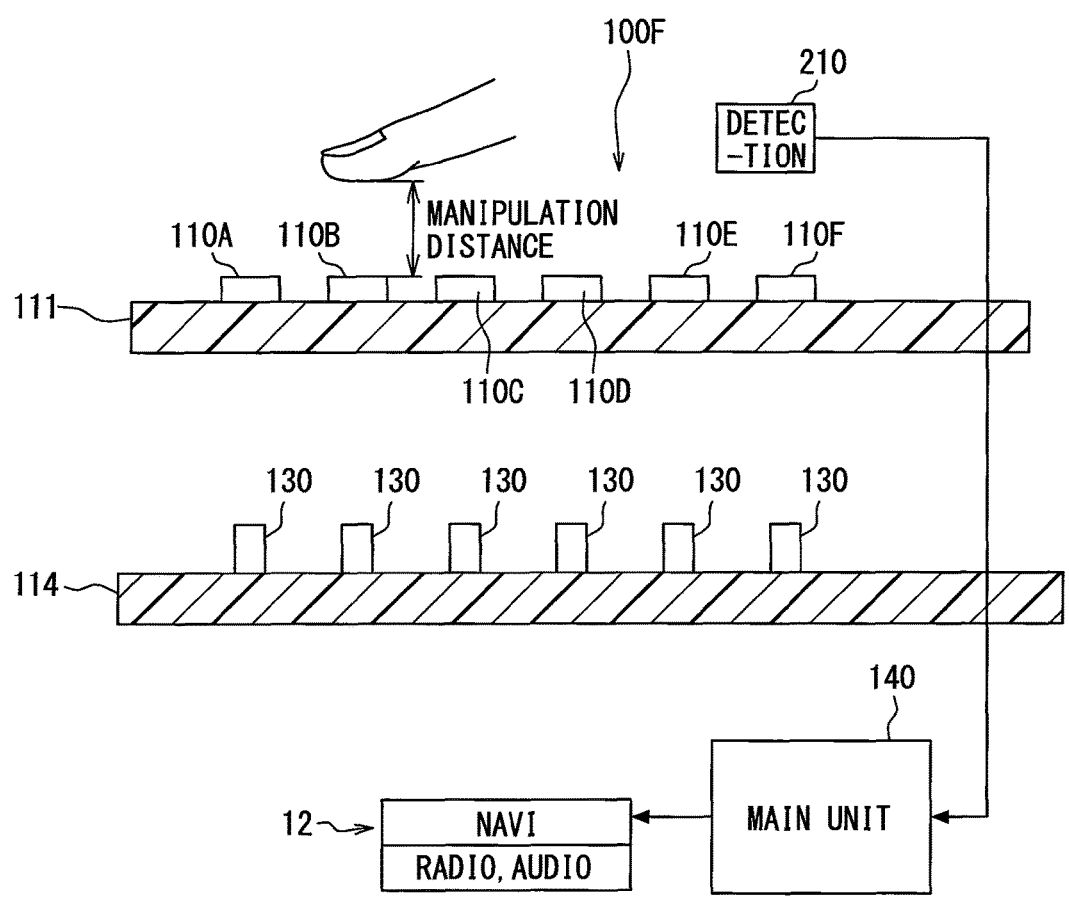
FIG. 21 is a sectional view illustrating a switch device for a vehicle according to a tenth embodiment.

FIG. 21 illustrates a switch device 100F according to the tenth embodiment. The first through ninth embodiments use the capacitance switches 110a through 110f. The tenth embodiment uses push-button switches or toggle switches 110A through 110F. The switches 110A through 110F are provided for the panel 111. The lighting LEDs 130 illuminate the switches 110A through 110F.

The switch device 100F includes a detection portion that detects a manipulation distance between the driver's finger and each of the switches 110A through 110F. A camera 210 may be used as the detection portion. The detection portion may be available as a sensor or a radar apparatus as well as the camera 210. The camera 210 is provided on a vehicle ceiling. The camera 210 can indirectly detect the manipulation distance by acquiring an image representing the positional relationship between the driver's finger and the switches 110A through 110F at a specified time interval. The manipulation distance detected by the camera 210 is input to the main unit 140.

The main unit 140 uses an approach determination threshold value and a switch-on determination threshold value to determine the manipulation distance. The approach determination threshold value is used to determine how far the driver's finger approaches the switches 110A through 110F. The switch-on determination threshold value is smaller than the approach determination threshold value and is used to determine which switch is turned on by the driver's finger.

Similarly to the first embodiment, the finger approaches the switches 110A through 110F. The camera 210 acquires several manipulation distances. The main unit 140 allows the lighting LED 130 to increase the brightness of all the switches (e.g., 110B through 110F) whose manipulation distances are smaller than the approach determination threshold value. The increased brightness is higher than the original brightness of the switches 110A through 110F.

When the finger approaches any of the switches 110A through 110F, the manipulation distance may be smaller than the approach determination threshold value and may be larger than the switch-on determination threshold value. In this state, the main unit 140 maintains the brightness control using the lighting LED 130.

When the manipulation distance is smaller than the switch-on determination threshold value, the main unit 140 turns on the corresponding switch (e.g., 110C) to operate the automobile navigation system 12. The main unit 140 then returns the brightness increased by the lighting LED 130 to the original brightness.

Similarly to the second embodiment, the target switch detection threshold value is provided between the approach determination threshold value and the switch-on determination threshold value. The main unit 140 allows the lighting LED 130 to increase the brightness of all the switches (e.g., 110B through 110F) whose manipulation distances are smaller than the approach determination threshold value. The increased brightness is higher than the original brightness of the switches 110A through 110F.

The main unit 140 allows the lighting LED 130 to increase the brightness of the switch portion (e.g., 110C) whose manipulation distance is smaller than the target switch detection threshold value and is larger than the switch-on determination threshold value. The increased brightness is higher than the brightness of the switches 110A through 110F. The main unit 140 changes the brightness adjustment state based on the approach determination threshold value.

When the manipulation distance is smaller than the switch-on determination threshold value, the main unit 140 turns on the corresponding switch (e.g., 110C) to operate the automobile navigation system 12. The main unit 140 then returns the brightness increased by the lighting LED 130 to the original brightness.

Even if the switches 110A through 110F are not the capacitance type, the use of the design portion enables to perform the brightness adjustment control similar to the first and second embodiments.

The third through ninth embodiments may be applied to the switch device 100F according to the tenth embodiment.

Other Embodiments

According to the first through ninth embodiments, the switches 110a through 110f or 110g through 110p mainly include the panel 111, the design portion 112a of the decorative layer 112, and the electrode portion 113c to provide a simple touch panel.

The switches are not limited thereto. A switch icon may be formed on the display 12a of the automobile navigation system 12 or on an image of the image display device. The switch icon may be applied to the design portion of the switch.

When the switch icon on the image display device is used as the design portion in the switch, the switch icon may frequently vary with screens that transition for the purposed of destination guidance setting. The driver may not be able to remember a switch icon position. In such a case, the brightness adjustment control can guide the driver in easily selecting the targeted switch.

The fourth embodiment uses the blackout switch that includes the smoked filter corresponding to the design or the character for each of the switches 110a through 110f. The purpose is to prevent visual identification of the design or the character for each of the switches 110a through 110f when the vehicle's ignition switch is turned off to turn off the lighting LED 130 as the illumination light source. The blackout switch is also applicable to the first through third embodiments and the fifth through tenth embodiments.

The flowchart or the flowchart process described in the application includes several sections (or referred to as steps). Each section is represented as S100, for example. Each section can be divided into sub-sections. Several sections can be collected into one section. Each section can be referred to as a device, a module, or a means.

In the embodiments, the design portion 112a is referred to as a specific design portion when the capacitance of the design portion 112a exceeds the approach determination threshold value and is made to be brighter than the other design portions 112a.

While there have been described the specific preferred embodiments of the present disclosure, it is to be distinctly understood that the disclosure is not limited to the embodiments and structures but may be otherwise variously embodied within the spirit and scope of the disclosure. The disclosure includes various modification examples and modifications within the applicable scope. It is also understood that the scope of the disclosure and the general inventive concept thereof cover preferred combinations and forms or the other combinations and forms including only one element or more or fewer than the same.

What is claimed is:

1. A switch device that is for a vehicle and inputs an operation condition to a specified instrument according to a manipulation by a finger of a user, the switch device comprising:
   a plurality of switch portions provided with design portions indicating switch functions, the design portions being illuminated by light sources, the plurality of switch portions overlapping with a plurality of electrode portions;
   a detection portion configured to detect a capacitance change corresponding to each of the electrode portions generated in accordance with a distance between the finger of the user and each of the electrode portions;
   a brightness adjustment portion configured to adjust a brightness of each of the light sources illuminating each of the design portions; and
   a control portion configured to perform a brightness adjustment control by:
   controlling the brightness adjustment portion to increase the brightness of the light sources for the design portions corresponding to all of the electrode portions with capacitances detected by the detection portion that exceed a predetermined approach determination threshold value to an increased brightness that is higher than an original brightness of the light sources,
   maintaining the brightness of the light sources that correspond to electrode portions with corresponding capacitances that exceed the approach determination threshold value while the corresponding capacitances exceed the approach determination threshold value and are less than a predetermined switch-on determination threshold value that is higher than the approach determination threshold value,
   turning on the switch portion corresponding to any of the electrode portions with corresponding capacitances that exceed the switch on determination threshold to operate the instrument, and subsequently returning the brightness of the light sources corresponding to any turned on switch portions to the original brightness.

2. The switch device according to claim 1, wherein the approach determination threshold value is referred to as a first approach determination threshold value,
   the control portion has the first approach determination threshold value and a second approach determination threshold value that is between the first approach determination threshold value and the switch-on determination threshold value, and
   the control portion is further configured to increase the brightness of the light sources for the design portions corresponding to all of the electrode portions whose capacitance acquired by the detection portion exceeds the second approach determination threshold value and falls short of the switch-on determination threshold value so that the increased brightness is higher than the original brightness of the light source for the design portion, to thereby change an adjustment state of the brightness based on the first approach determination threshold value.

3. The switch device according to claim 1, wherein
   at least a part of the design portion is used to increase brightness of the design portion.

4. The switch device according to claim 1, comprising:
   a recognition portion that allows the user to recognize that the switch portion is turned on, wherein
   the control portion operates the recognition portion in a period from a time the switch portion turns on to a time the brightness adjustment portion returns the brightness of the design portion to the original brightness.

5. The switch device according to claim 4, wherein
   the recognition portion includes at least one of a sound generator to generate sound for the user, a vibrator to vibrate the switch portion, a device to further increase brightness increased by the brightness adjustment portion, and a blink device to blink the brightness adjustment portion.

6. The switch device according to claim 2, wherein
   the switch portions are in black-out states in response to an off condition of the brightness adjustment portions and enables the original brightness of the design portions in response to an on condition of the brightness adjustment portions; and
   when the control portion increases the brightness of the light sources for the design portions corresponding to all the electrode portions whose capacitance exceeds the second approach determination threshold value and falls short of the switch-on determination threshold value so that the increased brightness is higher than the original brightness, the control portion turns off the brightness adjustment portions corresponding to other design portions.

7. A switch device that is for a vehicle and inputs an operation condition to a specified instrument according to a manipulation by a finger of a user, the switch device comprising:
   a plurality of switch portions provided with design portions displaying switch functions, the design portions being illuminated by light sources, the plurality of switch portions overlapping with a plurality of electrode portions;
   a detection portion configured to detect a capacitance change corresponding to each of the electrode portions generated in accordance with a distance between the finger of the user and each of the electrode portions;
   a brightness adjustment portion configured to adjust a brightness of each of the light sources illuminating each of the design portions; and
   a control portion configured to:
   decrease the brightness of the light sources for any design portions with corresponding electrode portions other than any electrode portions with capacitances detected by the detection portion that exceed a predetermined first approach determination threshold value so that the decreased brightness is lower than a predetermined night illumination brightness level, increase the brightness of the light sources for the design portions corresponding to any the electrode portions with capacitances that exceed a predetermined second approach determination threshold value higher than the first approach determination threshold value and that fall short of a predetermined switch-on determination threshold value that is higher than the second approach determination threshold value so that the increased brightness is higher than the predetermined night illumination brightness level, and turn on the switch portion corresponding to any of the electrode portions with corresponding capacitances that exceed the switch on determination threshold to operate the instrument and subsequently return the brightness of the light sources corresponding to any turned on switch portions to the predetermined night illumination brightness level.

8. The switch device according to claim 1, comprising:
a display portion that displays an operation state of the instrument corresponding to each of the switch portions, wherein
when the capacitance of the electrode portion exceeds the switch-on determination threshold value, the control portion highlights an operation state of the switch portion, on the display portion, corresponding to the electrode portion whose capacitance exceeds the switch-on determination threshold value.

9. The switch device according to claim 1, wherein the control portion performs the brightness adjustment control when the vehicle stops.

10. The switch device according to claim 1, comprising:
a setup portion that determines validity of the brightness adjustment control performed by the control portion according to a speed of the vehicle, wherein
the setup portion is configured to allow the user to set up a speed condition of the vehicle that enables the brightness adjustment control.

11. The switch device according to claim 1, wherein each of the design portions includes a switch icon in an image display device to form an image on a display surface, and
the brightness adjustment portion adjusts brightness of the image of the switch icon.

12. A switch device that is for a vehicle and inputs an operation condition to a specified instrument according to a manipulation by a finger of a user, the switch device comprising:
a plurality of switch portions for input;
a detection portion configured to detect a distance between the finger of the user and each of the switch portions;
a brightness adjustment portion configured to adjust a brightness of a plurality of light sources, each of the light sources being associated with one of the switch portions from the plurality of switch portions; and
a control portion configured to perform a brightness adjustment control by:
controlling the brightness adjustment portion to increase the brightness of the light sources for all of the switch portions with manipulation distances that are shorter than a predetermined approach determination threshold value to an increased brightness that is higher than an original brightness of the light sources,
controlling the brightness adjustment portion to maintain the brightness of the light sources at the increased brightness for any light sources corresponding to switch portions with corresponding manipulation distances that are smaller than the approach determination threshold value and larger than a predetermined switch-on determination threshold value that is smaller than the approach determination threshold value, and
turning on the switch portions with corresponding manipulation distances that are smaller than the switch on determination threshold value to operate the instrument and subsequently returning the brightness for the corresponding light sources increased by the brightness adjustment portion to the original brightness.

13. The switch device according to claim 12, wherein
the approach determination threshold value is referred to as a first approach determination threshold value,
the control portion has a second approach determination threshold value between the first approach determination threshold value and the switch-on determination threshold value,
the control portion is further configured to increase the brightness of all light sources corresponding to switch portions whose manipulation distance is smaller than the second approach determination threshold value and is larger than the switch-on determination threshold value so that the increased brightness is higher than original brightness of light sources, to thereby change an adjustment state of the brightness based on the first approach determination threshold value.

14. A switch device that is for a vehicle and inputs an operation condition to a specified instrument according to manipulation by a part of a body of a user, the switch device comprising:
a plurality of switch portions provided with design portions displaying switch functions, the design portions being illuminated by light sources, the plurality of switch portions overlapping with a plurality of electrode portions;
a detection portion configured to detect a capacitance change corresponding to each of the electrode portions generated in accordance with a distance between the part of the body of the user and each of the electrode portions;
a brightness adjustment portion configured to adjust a brightness of each of the light sources illuminating each of the design portions; and
a control portion configured to perform a brightness adjustment control by:
identifying all design portions corresponding to electrode portions with capacitances that exceed a first approach determination threshold value as specific design portions, and controlling the brightness adjustment portion so that a brightness of the light sources for the specific design portions is higher than a brightness of the light sources for design portions other than the specific design portions,
controlling the brightness adjustment portion to maintain the increased brightness for the light sources of the specific design portions when the capacitances of the electrode portions corresponding to the specific design portions range between the first approach determination threshold value and a second approach determination threshold value that is larger than the first approach determination threshold value, controlling, when a capacitance of the electrode portion corresponding to any of the specific design portion exceeds the second approach determination threshold value the brightness adjustment portion so that a brightness of the light sources for the specific design portions is higher than a brightness of the other specific design portions, and turning on the switch portion corresponding to any electrode portions with corresponding capacitances that exceed a switch on determination threshold value that is larger than the second approach determination value and controlling the brightness adjustment portion so that the brightness of the design portion of any switch portion that is turned on equals the brightness of all the other design portions.

* * * * *